United States Patent
Baldauf et al.

(10) Patent No.: US 8,912,606 B2
(45) Date of Patent: Dec. 16, 2014

(54) INTEGRATED CIRCUITS HAVING PROTRUDING SOURCE AND DRAIN REGIONS AND METHODS FOR FORMING INTEGRATED CIRCUITS

(75) Inventors: Tim Baldauf, Dresden (DE); Tom Herrmann, Dresden (DE); Stefan Flachowsky, Dresden (DE); Ralf Illgen, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 30 days.

(21) Appl. No.: 13/454,433

(22) Filed: Apr. 24, 2012

(65) Prior Publication Data
US 2013/0277746 A1    Oct. 24, 2013

(51) Int. Cl.
*H01L 21/70* (2006.01)

(52) U.S. Cl.
USPC .......................................... 257/368

(58) Field of Classification Search
CPC .................................... H01L 27/088
USPC ................... 257/255, 288, 347; 438/283, 294
See application file for complete search history.

(56) References Cited

U.S. PATENT DOCUMENTS

| | | | |
|---|---|---|---|
| 6,812,075 B2 | 11/2004 | Fried et al. | |
| 2007/0254441 A1 | 11/2007 | Wei et al. | |
| 2008/0026531 A1 | 1/2008 | Beyer et al. | |
| 2009/0026505 A1* | 1/2009 | Okano | 257/255 |
| 2010/0207209 A1 | 8/2010 | Inokuma | |
| 2011/0291196 A1 | 12/2011 | Wei et al. | |
| 2013/0052778 A1* | 2/2013 | Liao et al. | 438/197 |
| 2013/0056827 A1* | 3/2013 | Tsai et al. | 257/347 |
| 2013/0062669 A1* | 3/2013 | Chen et al. | 257/288 |
| 2013/0154006 A1* | 6/2013 | Basker et al. | 257/347 |

FOREIGN PATENT DOCUMENTS

| | | |
|---|---|---|
| JP | 2008085357 A | 4/2008 |
| JP | 2010171337 A | 8/2010 |

OTHER PUBLICATIONS

Translation of Official Communication from German Patent Application No. 10 2012 214 077.8 dated Nov. 28, 2012.

* cited by examiner

*Primary Examiner* — Michael Lebentritt
*Assistant Examiner* — Ismail Muse
(74) *Attorney, Agent, or Firm* — Amerson Law Firm, PLLC

(57) ABSTRACT

Methods for forming integrated circuits and integrated circuits are disclosed. The integrated circuits comprise gate structures overlying and transverse to one or more fins that are delineated by trenches formed in a semiconductor substrate. Protruding portions are formed in the trenches in between the gate electrode structure on exposed sidewall surfaces of the one or more fins. The trenches are filled with an insulating material between the protruding portions and the gate structures.

14 Claims, 15 Drawing Sheets

US 8,912,606 B2

INTEGRATED CIRCUITS HAVING PROTRUDING SOURCE AND DRAIN REGIONS AND METHODS FOR FORMING INTEGRATED CIRCUITS

BACKGROUND OF THE INVENTION

1. Field of the Invention

The present invention generally relates to integrated circuits and methods for forming integrated circuits, and, more particularly, to integrated circuits having protruding source and drain regions and methods for forming integrated circuits.

2. Description of the Related Art

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FinFET is a type of transistor that lends itself to the dual goals of reducing transistor size while maintaining transistor performance. The FinFET is a three-dimensional transistor which has a thin fin that extends upwardly from a semiconductor substrate. Transistor performance, often measured by its transconductance, is proportional to the width of the transistor channel. In a FinFET, the transistor channel is formed along the vertical sidewalls of the fin, which is also frequently referred to as a double gate transistor, or along the vertical sidewall surfaces and the upper horizontal surface of the fin, leading to a so-called tri-gate transistor. Double gate transistors and tri-gate transistors have a wide channel, and hence high performance, which can be achieved without substantially increasing the area of the substrate surface required by said transistors.

As opposed to planar MOS transistors, which are well known in the art and so their features need not be explained, FinFETs are less well known, so that the following brief explanations with regard to FIGS. 1a and 1b are provided to identify their features.

FIG. 1a illustrates, in a cut-away perspective view, a portion of a FinFET integrated circuit (IC) 100a. The illustrated portion of IC 100a includes two fins 102a and 104a that are formed from and extend upwardly from a bulk semiconductor substrate 106a. A gate electrode 108a overlies the two fins 102a and 104a and is electrically insulated from the fins 102a, 104a by a gate insulator (not illustrated). End 110a of fin 102a is appropriately impurity doped to form the source of a field effect transistor 112a, and end 114a of that fin is appropriately impurity doped to form the drain of the FET. Similarly, ends 116a and 118a of fin 104a form the source and drain, respectively, of another FET 120a. The illustrated portion of IC 100a thus includes two FinFETs 112a and 120a having a common gate electrode. In another configuration, if source 110a and 116a are electrically coupled together and drain 114a and 118a are electrically coupled together, the structure would be a two-fin FinFET having twice the gate width of either FET 112a or 120a. Oxide layer 122a forms electrical isolation between fins and between adjacent devices as is needed for the circuit being implemented. The channel of FinFET 112a extends along the sidewall 124a of fin 102a beneath gate electrode 108a, along the top 125a of the fin, as well as along the opposite sidewall not visible in this perspective view. The advantage of the FinFET structure is that, although the fin has only the narrow width represented by the arrows 126a, the channel has a width represented by at least twice the height of the fin above oxide 122a. The channel width thus can be much greater than the fin width.

As it becomes clear from the explanations regarding a FinFET configuration as shown by FIG. 1a, the source and drain regions are formed within individual fins. A common gate electrode overlies one or more fins defining the channel region of respective fins, while a continuous isolation layer is provided in the transistor pitch embedding the fin except the portion of the fin over which the gate electrode is formed. An according FinFET configuration may be manufactured in accordance with unpublished methods for fabricating integrated circuits. However, there is still another possible configuration for FinFETs which will be explained with reference to FIG. 1b.

FIG. 1b schematically illustrates a perspective view of a FinFET integrated circuit (IC) 100b corresponding to a three-dimensional transistor configuration or tri-gate transistor configuration. As illustrated, corresponding semiconductor fins 110b may be provided in an active region 101b in combination with a dielectric material 106b. Herein, an effective fin height is adjusted by the amount or height of the dielectric material 106b filled in between the semiconductor fins 110b. The opening 120b may be provided within the gate electrode structure which is substantially represented by the spacer structure 122b, possibly in combination with a gate dielectric material, which may be formed on any exposed surface areas of the active region 101b and the semiconductor fins 110b. The opening 120b is depicted in FIG. 1b instead of a gate electrode material in order to allow for a clear perspective illustration of IC 100b and it is understood that opening 120b is filled with appropriate gate electrode material to form a gate electrode overlying fins 110b. It is understood that the dielectric material 106b may be any appropriate dielectric material, such as a high-k dielectric material and the like. Source regions 110bS and drain regions 110bD are formed in the active region 101b at respective ends of fins 110b. However, the source regions 110bS and the drain regions 110bD are not constituted by the fins 110b, i.e., are not formed in the fins 110b. A contact layer 140b which is shown in FIG. 1b has a stress-inducing layer 141b for enhancing mobility properties of charge carriers within the channel regions and another dielectric layer 142b is formed over the stress-inducing layer 141b. The IC 100b is manufactured by etching a gate recess into an active region of a semiconductor substrate and by forming fins within the gate recess by means of an appropriate mask or hard mask. In filling the gate recess with a gate electrode material, the gate electrode is formed in the gate recess over the fins. An according manufacturing method is disclosed in US patent application publication 2011/0291196.

FinFET configurations as depicted in FIG. 1b show various drawbacks which degrade device performance of semiconductor devices having said FinFETs. As is obvious from FIG. 1b, when a gate electrode is formed within recess 120b, severe parasitic capacitances will form between the gate electrode and the source regions 110bS and drain regions 110bD resulting in significantly high gate capacitances. The reason is that portions of the gate electrode disposed over sidewall surfaces of the fins cover portions of surfaces of the drain and source regions which face the gate electrode. Accordingly, these surfaces of source/drain and of the gate electrode form capacitors having undesirable high capacitances resulting in too high parasitic capacitances. FIG. 1c shows a diagram depicting graphical representations of relations between capacitance normalized to effective gate width (C measured in fF/µm, ordinate axis) plotted against gate bias (voltage applied to gate electrode measured in Volt (V), abscissa) for a FinFET according to a configuration as displayed in FIG. 1a, a FinFET according to a configuration as depicted in FIG. 1b and a conventional planar FET configuration. Reference numeral 110c denotes a curve representing behavior of a FinFET which is displayed in FIG. 1b. Reference numeral 120c denotes a curve representing behavior of a planar FET configuration and reference numeral 130c denotes a curve representing behavior of a FinFET configuration as explained with regard to FIG. 1a. FIG. 1c clearly shows that a capacitance of a FinFET according to a configuration in which the fin is formed in a gate recess (as depicted in FIG. 1b) is considerably higher than the capacitance of a planar FET. Even if the planar FET and the FinFET have similar effective gate widths, the capacitance of the FinFET is approximately twice as much as the capacitance of the planar FET. The reason is due to considerable parasitic capacitances formed between the gate electrode and source/drain regions, which are avoided in planar FET configurations. Although FinFET configurations as depicted in FIG. 1a suppress formation of parasitic capacitances between the gate electrode and source/drain regions formed within fins at their respective ends, the capacitance of according FinFETs is still higher than that of planar FETs (compare curve 130c versus curve 120c). In comparison to FinFETs as depicted in FIG. 1b, FinFETs as shown in FIG. 1a have lower parasitic capacitances between the gate electrode and source/drain regions as these are not disposed to directly face each other. Despite their advantageous characteristics with regard to aforementioned parasitic capacities, FinFETs as depicted in FIG. 1a show an increased resistance in comparison with FinFETs as depicted with regard to FIG. 1b.

In FIG. 1d, a diagram is shown in which a resistance (resistance $R_{ON}$ normalized to effective gate width measured in Ωµm, ordinate axis) is plotted against the gate length ($L_{GATE}$ measured in nm, abscissa) for a FinFET as depicted in FIG. 1a which is denoted by 110d and a FinFET as depicted in FIG. 1b which is denoted by 120d. FIG. 1d suggests that a resistance of a FinFET as depicted in FIG. 1a having source and drain regions formed within a fin is higher than that of a FinFET as depicted in FIG. 1b having source and drain regions formed adjacent to fins. The reason is that source and drain regions formed within a fin are limited by the fin width and show degraded resistance properties due to their smaller sizes. When taking the electrostatic behavior into consideration, a FinFET as depicted in FIG. 1a results in poor device performance as compared to a FinFET as shown in FIG. 1b.

FIG. 1e shows a diagram of a universal curve obtained by plotting a normalized electric drain current during an off state ($I_{D,OFF}$ normalized to the effective gate width and measured in nA/µm, ordinate axis) against a normalized electrical drain saturation current during operation ($I_{D,Sat}$ normalized to the effective gate width and measured in µA/µm, abscissa) for a FinFET as depicted in FIG. 1a which is denoted by 110e and a FinFET as depicted in FIG. 1b which is denoted by 120e. It is shown that at the same $I_{D,Sat}$ the normalized electric drain current during an off state for FinFETs as depicted in FIG. 1a is substantially higher than the normalized electric drain current during an off state for FinFETs as depicted in FIG. 1b. Usually, drive currents ($I_{D,Sat}$) are compared at same $I_{D,off}$.

FIGS. 1c-1e illustrate that a FinFET according to a configuration as depicted in FIG. 1a shows a lower capacitance in comparison with a FinFET according to a configuration as depicted in FIG. 1b, though the electrostatic behavior and the resistance of a FinFET according to FIG. 1a is disadvantageous as compared to a FinFET according to a configuration as depicted in FIG. 1b.

U.S. Pat. No. 6,812,075 B2 shows a vertically oriented FET having a self-aligned dog-bone structure, wherein each of the source and drain regions have tapered portions abutting the channel region. A gate electrode is formed over the tapered portions and the channel region significantly increasing a surface of the gate electrode facing the source and drain regions. Therefore, known FET configurations having the dog-bone structure even have higher parasitic capacitances while showing detrimental electrostatic behaviors and high resistances, leading to problems when manufacturing semiconductor devices with high performance and low power consumption.

Another problem that is encountered in the fabrication of MOSFET integrated circuits as the device size shrinks is the correct placement of contacts, for example the contacts to the source and drains of individual transistors. As the pitch (the spacing from gate to gate) decreases below a certain dimension, it is important to have a self-aligning method for positioning the contacts. In order to reduce series resistance, it is also important to form silicided contacts to the source and drain regions. Metal silicides must not be subjected to high temperatures, so the silicided contacts, including self-aligned silicided contacts, must be formed after most of the high temperature processing steps.

Accordingly, it is desirable to provide methods for fabricating integrated circuits that include FinFETs having improved dynamical and electrical properties. It is also desirable to provide methods for fabricating integrated circuits with self-aligned contacts. Furthermore, other desirable features and characteristics of the present disclosure will become apparent from the subsequent detailed description and the appended claims, taken in conjunction with the accompanying drawings and the foregoing technical field and background.

Accordingly, it is an object to provide FinFETs having improved dynamical behavior and showing improved electrical properties while enabling high performance and improved power characteristics at further reduced dimension nodes.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides an integrated circuit having protruding portions and methods for forming an according integrated circuit. According to some aspects of the present disclosure, a method for forming an integrated circuit may be provided. A plurality of fins and trenches may be provided in a silicon substrate and gate structures may be formed overlying and traverse to the plurality of fins. The fins may be further processed such that protruding portions aligned with the gate structures may be formed at both sides of a fin. An insulating material may be formed to between the gate structures and the protruding portions.

According to further aspects of the present disclosure, a masking pattern may be formed over a semiconductor bulk material, the masking pattern having strip-shaped portions and protruding portions, each protruding portion having at least one tapered portion tapering against the respective strip-shaped portion. Semiconductor material may be removed in accordance with the masking pattern to form recesses in contact with the tapered portions. The recesses are filled with an insulating material.

According to other aspects of the present disclosure, a method for forming an integrated circuit may be provided. A plurality of fins and trenches may be formed in a silicon substrate. In forming an appropriate mask or hard mask over the substrate, a plurality of protruding portions may be formed at both sides of each fin projecting away from the respective fin into the trench. Subsequently, gate structures may be formed overlying and transverse to the plurality of fins between the protruding portions.

According to still other aspects, the present disclosure may provide an integrated circuit having one or more fins provided in a substrate and gate structures may be formed over the substrate and transverse to the one or more fins. Protruding portions may be formed at either side of the one or more fins between the gate structures. An insulating material may be provided between the protruding portions and the gate structures.

Certain embodiments of the present disclosure have other aspects in addition to or in place of those mentioned or which are obvious from the above. The aspects will become apparent to those skilled in the art from reading the following detailed description when taken with reference to the accompanying drawings.

BRIEF DESCRIPTION OF THE DRAWINGS

The disclosure may be understood by reference to the following description taken in conjunction with the accompanying drawings, in which like reference numerals identify like elements, and in which.

Figure 1A:
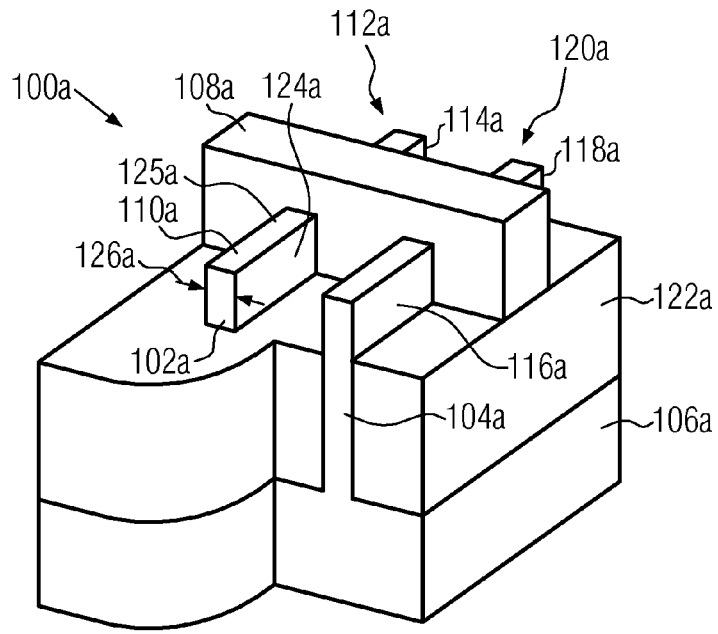
FIG. 1a illustrates a conventional FinFET in a partially cut-away perspective view.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make and use the invention. It is to be understood that other embodiments would be evident based on the present disclosure, and that system, structure, process or mechanical changes may be made without departing from the scope of the present disclosure. In the following description, numerous specific details are given to provide a thorough understanding of the disclosure. However, it will be apparent that the embodiments of the disclosure may be practiced without these specific details. In order to avoid obscuring the present disclosure, some well-known circuits, system configurations, structure configurations and process steps are not disclosed in detail.

The drawings showing embodiments of the present disclosure are semi-diagrammatic and are not to scale and, particularly, some of the dimensions are for clarity of presentation and are exaggeratedly shown in the figures. Similarly, although the views in the drawings generally show similar orientations for ease of description, this depiction in the figures is arbitrary for the most part. Generally, the embodiments of the disclosure can be operated in any orientation.

The multiple embodiments are disclosed and described having some features in common, for clarity and ease of illustration, description and comprehension thereof, similar and like features are ordinarily described with similar reference numerals as a matter of descriptive convenience. Various different embodiments are described with regard to one or more common figures as a matter of descriptive convenience. It is to be understood that this is not intended to have any other significance or provide any limitation for the present disclosure. Any numeration of embodiments, may it be explicit as $1^{st}$ embodiment, $2^{nd}$ embodiment, etc., or implied, is a matter of descriptive convenience and is not intended to provide any other significance or limitation for the present disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

FinFETs may be formed on a bulk substrate, that is the fin elements for accommodating the channel regions of the transistors may be formed within a semiconductor layer, wherein a height of the fins is substantially less than a thickness of the corresponding semiconductor layer. Thus, in this sense, any transistor configuration having additional semiconductor volume, such as silicon volume, provided below the actual fin elements may be considered as a bulk configuration, irrespective of whether any further buried insulating layer may be provided in the "depth" of the bulk semiconductor layer. After completing the basic structure for the fins and the two or three gate electrode structures in combination with the low resistance drain and source areas, which may be accomplished, in some illustrative embodiments, in a self-aligned manufacturing sequence, well-established planar process techniques may be used for adjusting the drain and source dopant profile, enhancing overall series resistance of the channel region, for instance by applying strain-inducing mechanisms and the like. Consequently, the advantages of a three-dimensional transistor configuration may be maintained while significantly reducing drive current limitations of conventional Fin-FETs, while at the same time providing a highly efficient overall manufacturing process flow.

Integrated circuits (ICs) can be designed with millions of transistors. Many ICs are designed using metal oxide semiconductor (MOS) transistors, also known as field effect transistors (FETs) or MOSFETs. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. MOS transistors used in the design of ICs can be either planar MOS transistors or FinFETs, with each type of device having certain unique advantages and disadvantages. Both types of MOS transistors can be fabricated as P-channel transistors and as N-channel transistors, and both can be fabricated with or without mobility enhancing stress features. A circuit designer can mix and match device types, using P-channel and N-channel, planar MOS and FinFET, stressed and unstressed, to take advantage of the best characteristics of each device type as they best suit the circuit being designed.

According to some embodiments of the present disclosure, a method for forming an integrated circuit is provided. The method comprises etching a plurality of trenches into a silicon substrate and filling the trenches with a first insulating material to delineate a plurality of spaced-apart silicon fins. Gate structures overlying and transverse to the plurality of fins are formed. The first insulating material is removed for forming recess trenches between the gate structures and for exposing at least sidewall portions of the spaced-apart silicon fins such that the recess trenches have a depth corresponding to a first height. Protruding portions of semiconductor material are formed on the exposed sidewall portions of the fins, wherein the protruding portions of semiconductor material each have at least one tapered surface tapering towards the respective fin. The recess trenches are filled with a second insulating material up to at least the first height.

According to other embodiments of the present disclosure, a method for forming an integrated circuit is provided. A masking pattern is formed over a silicon substrate patterning strip-shaped patterning portions and a plurality of protruding portions at both sides of the strip-shaped patterning portions, each protruding portion having at least one tapered portion tapering towards the respective strip-shaped patterning portion. The substrate material is removed according to the formed mask and the recesses are filled with an insulating material. Gate structures are formed overlying the recesses such that the tapered portions are exposed.

According to still other embodiments of the present disclosure, an integrated circuit is provided. The integrated circuit comprises one or more fins provided in a semiconductor substrate, wherein the one or more fins are delineated by trenches formed in the semiconductor substrate. Gate structures are formed over the substrate and transverse to the one or more fins, wherein the gate structures are formed on the upper surface of the one or more fins and on at least portions of two sidewall surfaces of the one or more fins. Protruding portions are formed on either side of the one or more fins between the gate structures, wherein each protruding portion has at least one tapered surface tapering towards the respective fin. Insulating material is formed in the trenches covering the tapered portions.

When describing the following figures, methods for forming an integrated circuit (IC) and/or integrated circuits (ICs) in accordance with various exemplary embodiments of the present disclosure will be illustrated. The described process steps, procedures and materials are to be considered only as exemplary embodiments designed to illustrate to one of ordinary skill in the art methods for practicing the invention. However, it is to be understood that the invention is not to be limited to these exemplary embodiments. Illustrated portions of ICs may include only a single FinFET and an optional planar MOS transistor, although those of skill in the art will recognize that an actual IC may include a large number of such transistors. The illustrated FinFETs according to the present disclosure may be similar to FinFETs 112a and 120a or 100b described above. Initial steps as described below may relate specifically to the fabrication of P-channel transistors, but the processing steps also can be used to fabricate N-channel transistors alone or in combination with P-channel transistors as will be appreciated by the person skilled in the art. Various steps in the manufacture of ICs are well known and so, in the interest of brevity, many conventional steps will only be mentioned briefly herein or will be omitted entirely without providing the well-known process details.

Figure 2A:
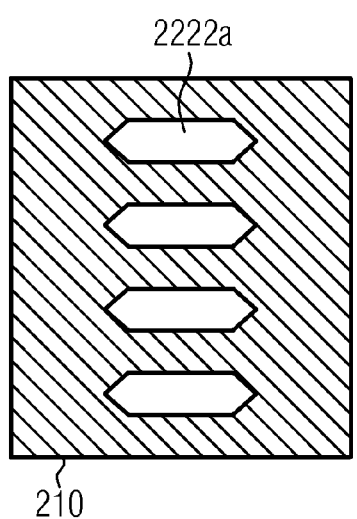
FIGS. 2a and 2b depict a schematic illustration of a masking pattern according to some exemplary embodiments of the present disclosure.

FIG. 2a illustrates, in a plan view, a portion of a semiconductor bulk substrate on which a masking pattern 210 is formed, for example by known lithography techniques. The masking pattern may leave regions 2222a of the semiconductor bulk material uncovered, The regions may have a substantially elongated form being wedge-shaped at both ends. The person skilled in the art will appreciate that a length of substantially elongated portions of the uncovered regions 2222a extending between the wedge-shaped ends may be related to or represent a gate length of a transistor to be formed in the bulk substrate. The person skilled in the art understands that the masking pattern may be a mask or hard mask disposed over the semiconductor bulk material leaving uncovered regions 2222a uncovered, i.e., that no mask or hard mask is disposed over the uncovered regions 2222a thus remaining exposed to further processing. According to some exemplary embodiments herein, one or more etching steps may be performed in order to remove semiconductor material such that recesses are formed in the uncovered regions 2222a. The person skilled in the art understands that a depth of the recesses may be adjusted by performing a time controlled etching step. The person skilled in the art understands that the etching step may be anisotropic. Then the recesses (now represented in FIG. 2a by the regions 2222a) may be filled with an insulating material. According to some exemplary embodiments, the insulating material may be a so-called low-k or ultra low-k material having a dielectric constant smaller than 4.0. The elongated portions of the regions filled with insulating material may delineate fins as the person skilled in the art will appreciate. Subsequently, well-known techniques may be performed to form a gate structure overlying the recesses and leaving the wedge-shaped ends of the recesses substantially uncovered. The person skilled in the art will understand that source and drain regions may be formed at both sides of the gate structure resulting in source and drain regions having tapering portions on which an insulating material is formed. In the exemplary embodiments as explained with regard to FIG. 2a, the source and drain regions may be connected.

Figure 2B:
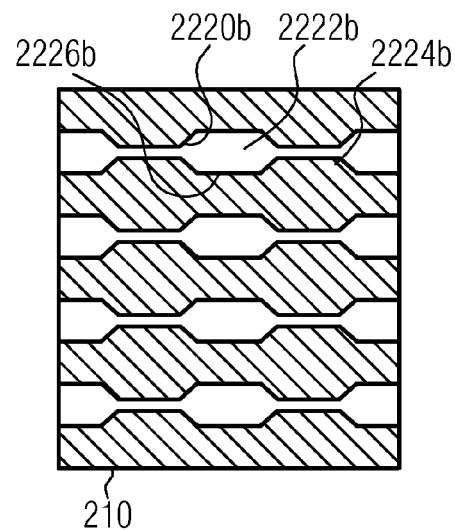

FIG. 2b illustrates, in a plan view, a portion of a semiconductor bulk substrate on which a masking pattern 210 is formed, for example by known lithography techniques. The masking pattern 210 may have protruding portions 2224b such that the protruding portions may be disposed at both sides of a strip-shaped masking pattern 2226b. The protruding portions 2224b may have at least one tapering portion 2220b (note that although two tapering portions are depicted in FIG. 2b, this does not pose any limitation on the present disclosure; there may be only one tapering portion formed at each protruding portion as well). The person skilled in the art will appreciate that a length of a strip-shaped masking pattern 2226b extending between protruding portions may be related to or represent a gate length of a transistor to be formed in the bulk substrate. The person skilled in the art understands that the masking pattern 210 may be a mask or hard mask disposed over the semiconductor bulk material. According to some exemplary embodiments herein, one or more etching steps may be performed in order to remove semiconductor material which is not covered by the masking pattern such that recesses are formed. The person skilled in the art understands that a depth of the recesses may be adjusted by performing a time controlled etching step. The person skilled in the art understands that the etching step may be anisotropic. Then the recesses may be filled with an insulating material. According to some exemplary embodiments, the insulating material may be a so-called low-k or ultra low-k material having a dielectric constant smaller than 4.0. Subsequently, well-known techniques may be performed to form a gate structure overlying the thus formed patterned surface of the bulk material and substantially transverse to a direction along which the strip-shaped masking pattern extends. The person skilled in the art will understand that source and drain regions may be formed at the protruding portions or even within the protruding portions due to techniques as known in the art.

Figure 2C:
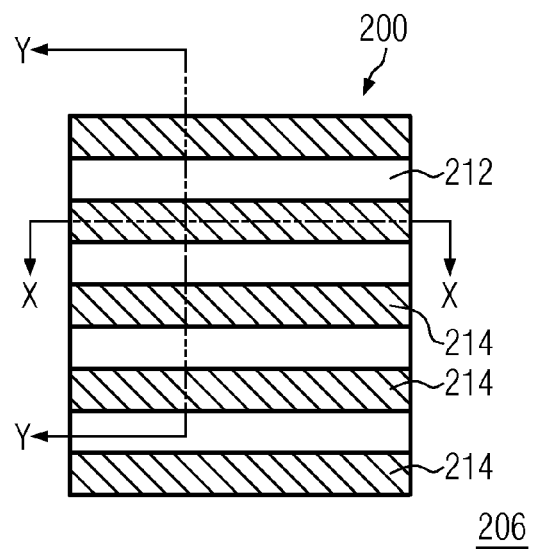
FIG. 2c shows a schematic top view of a substrate having fins and trenches formed therein according to some exemplary embodiments of the disclosure.

Other exemplary embodiments will now be described with regard to the following figures. FIG. 2c illustrates, in plan view, a portion of an integrated circuit (IC) 200 at an early stage of formation. The illustrated portion may include a device area 206 in which FinFETs such as FinFET 202 may be formed. IC 200 may be formed on a bulk semiconductor wafer (reference numeral 210 as illustrated in subsequent figures). An insulating material 212 may separate, delineate, and electrically isolate the two device areas. The insulating material can be, for example, part of a shallow trench isolation (STI). STI, as is well known, may include a trench that may be etched into wafer 210 and may be subsequently filled with an oxide or other insulating material. Insulating material 212 may also extend across device area 206 to delineate a plurality of spaced apart silicon fins 214. The fins may be formed by the formation of the STI, but they may not be revealed at this point in the processing. The fins may be revealed later as is explained below. The width and height of the fins can be adjusted based on the needs of the circuit being implemented. The fins can be, for example, about 5-50 nm in width and about 5-50 nm in height. Preferably the height and width may be paired such that a relatively tall fin may be relatively thin and a relatively short fin may be wide where "tall" and "short," "thin" and "wide" are relative terms within the broad range of exemplary dimensions. This pairing of height and width may allow the gates to fully deplete.

The person skilled in the art will appreciate that according to some alternative exemplary embodiments, protruding portions may now be formed at the sides of the fins or that source and drain regions having tapering portions may be formed by an appropriate masking pattern. The masking pattern may cover the fins and portions of the trenches to leave some portions of the trenches between the fins uncovered. The masking patterns may be formed in accordance with the masking patterns as described with regard to FIGS. 2a and 2b. The person skilled in the art understands that subsequent to accordingly masking the fins and trenches, recesses may be formed in the unmasked portions of the trenches by removing insulating material. After forming semiconductor material in the trenches, for example by selective deposition of semiconductor material on exposed surfaces of the fins within the recesses, protruding portions may be corresponding to protruding and tapering portions as explained with regard to FIGS. 2a and 2b. The person skilled in the art understands that the semiconductor material deposited on exposed surfaces of the fins within the recesses may be, for example, silicon, silicon germanium, silicon boron, silicon carbide, silicon arsenic or combinations thereof (the list is not limited to the explicitly given illustrative examples, but may be any appropriate semiconductor material). The person skilled in the art appreciates that the material may as well have some stress-inducing properties to impose stress on at least a portion of the fins 214. The accordingly filled recesses may form protruding portions of the material at both sides of each fin. Each fin may have at least one protruding portion formed along a portion of each of its sides, the protruding portions projecting into the trench and extending away from the fin. The protruding portions may have tapered surfaces tapering towards the respective fins. Then, according to some exemplary embodiments herein, gate structures (not shown) overlying and transverse to the plurality of fins may be formed between the protruding portions such that the protruding portions may remain exposed. The person skilled in the art understands that the gate structures may be disposed between the protruding portions. The person skilled in the art appreciates that prior to forming the gate structures, a insulating material layer may be formed on the protruding portions, wherein the insulating material may be different from the patterning material, i.e., the material of the mask or hard mask, and that the mask or hard mask may be removed selectively with regard to the insulating material layer formed. Other exemplary embodiments for forming protruding portions will now be explained with regard to the following figures.

Figure 3:
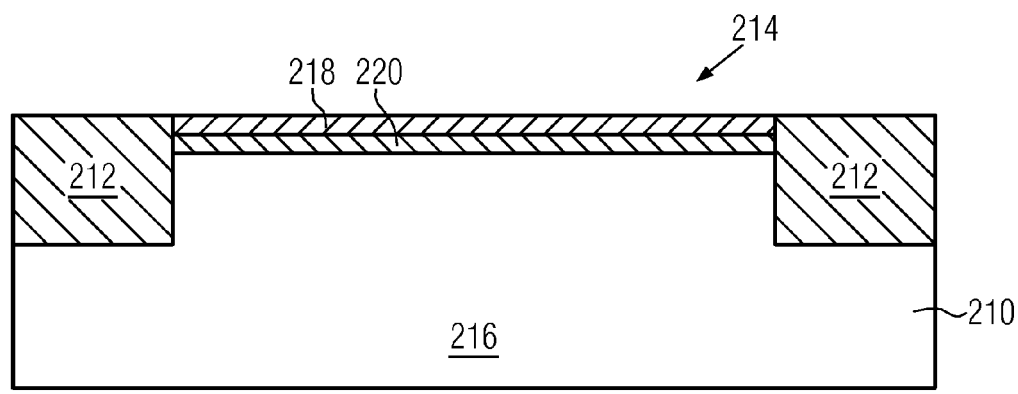
FIG. 3 shows a schematic sectional view of an integrated circuit structure in an early formation stage according to an exemplary embodiment of the disclosure.

FIG. 3 schematically illustrates, in cross-section taken along line X-X in FIG. 2c, initial method steps in accordance with one exemplary embodiment for forming IC 200. FIG. 3 illustrates only a portion of device area 206 and of fin 214.

Following the formation of the STI 212, conductivity determining dopant impurities may be implanted into bulk semiconductor wafer 210 to form a doped well 216. Bulk semiconductor wafer 210 can be silicon, silicon admixed with germanium or carbon, or other semiconductor materials commonly used in the formation of integrated circuits, but for simplicity will herein be simply referred to as a silicon substrate. Doped well 216 may be doped with N-type dopant impurities, such as arsenic or phosphorus, to form a P-channel FinFET, and may be doped with P-type dopant impurities, such as boron, to form an N-channel FinFET. Areas that are not to be implanted during the well implant step can be masked, for example, with a patterned layer of photoresist. The person skilled in the art will appreciate that multiple implants may be used to tailor the implant dose and dopant profile. As also illustrated in FIG. 3, an undoped epitaxial layer of channel silicon 218 may be grown overlying the doped well. The undoped silicon in the channel of the transistor may help to overcome short channel effects and threshold variations across the IC. Achieving an undoped layer in conventional manner may be difficult because of implant straggle and out-diffusion from the doped well during subsequent thermal processing. In accordance with exemplary embodiments of the present disclosure, the undoped channel may be successfully achieved by first epitaxially growing a layer 220 of silicon doped with carbon that is known to block the diffusion of boron and arsenic. During growth of layer 220, the reactants can be adjusted to add carbon in the amount of about 0.3% to the grown layer. A carbon doped layer having a thickness of about 1 nm or of about 5 nm or of about 10 nm or in a range between about 1 nm and about 10 nm or in a range between about 5 nm and about 10 nm may be sufficient to substantially block out-diffusion from the well region. Undoped layer 218 may be grown to a thickness at least equal to the intended height of the active fin. The person skilled in the art understands that the STI may be formed first, then the wells may be doped, and then the epitaxial layers may be grown as described. Although not illustrated, the person skilled in the art will appreciate that, in an alternate embodiment, alignment marks may be etched in the surface of the wafer, well regions may be implanted, the epitaxial layers may be grown on a flat surface without pattern loading effects.

The person skilled in the art understands that undoped layer 218 and layer 220 may be omitted. It is, therefore, noted that, according to other exemplary embodiments, IC 200 may not have layers 218 and 220, i.e., according figures would not depict layers 218, 220, although the other features as described with regard to FIG. 3 may be present and depicted.

Figure 4A:
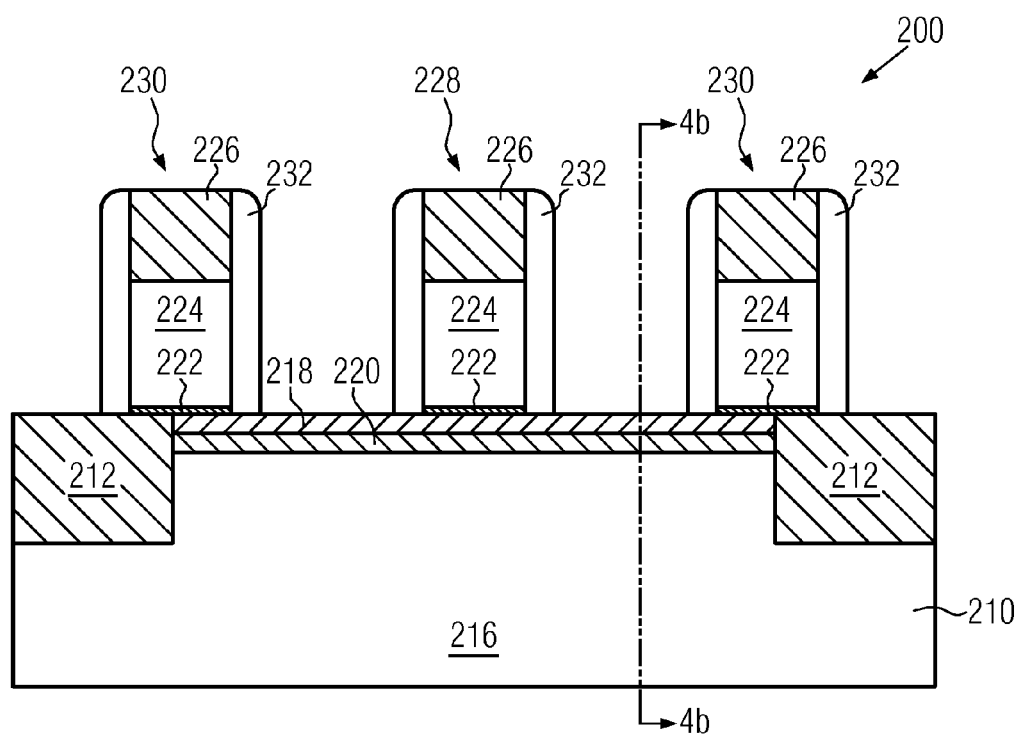
FIG. 4a shows a schematic sectional view of an integrated circuit structure in an early formation stage according to an exemplary embodiment of the disclosure.

The method may continue as illustrated in FIG. 4a by forming a gate structure overlying and transverse to the fins and the trenches. The gate structure may represent a gate electrode structure such that a so-called gate first process may be performed or the gate structure may be a dummy gate, such that gate replacement processes may apply. The person skilled in the art understands that the present disclosure is not limited to gate first processes or replacement gate processes.

In the exemplary embodiments as described with regard to the following figures, the gate structure may represent a dummy gate structure. In accordance with the aforementioned, the person skilled in the art understands that this does not pose any limitations on the present disclosure. The person skilled in the art appreciates that though dummy gate structures will be described, gate electrode structures may be described as well. The method may continue in forming a dummy gate oxide layer 222, a layer of silicon germanium (SiGe) or of polysilicon 224, and a capping layer 226. Each of the layers can be deposited, for example, by chemical vapor deposition (CVD), low pressure chemical vapor deposition (LPCVD) or plasma enhanced chemical vapor deposition (PECVD). Layer 222 may be, for example, a layer of silicon oxide having a thickness of 1.5-2 nm, layer 224 may be a layer of amorphous silicon germanium or of polysilicon and may have a thickness of 50-60 nm, and capping layer 226 may be a layer of silicon nitride having a thickness of about 40 nm. Instead of being deposited, dummy gate oxide layer 222 may be thermally grown. Layers 226, 224 and 222 may be photolithographically patterned and etched to form dummy gate structures 228 and 230. After forming dummy gate structures 228 and 230, sidewall spacers 232 may be formed on the sidewalls of the dummy gate structures. Similar structures may be formed overlying device area 208.

The person skilled in the art understands that undoped layer 218 and layer 220 may be omitted. It is, therefore, noted that, according to other exemplary embodiments, IC 200 may not have layers 218 and 220, i.e., according figures would not depict layers 218, 220, although the other features as described with regard to FIG. 4a may be present and depicted.

The person skilled in the art appreciates that the dummy gate structures 228, 230 as described above with regard to FIG. 4a may be gate electrode structures in alternative exemplary embodiments. The gate electrode structures may be formed by forming a high-k dielectric material 222, a gate material 224 and a capping layer 226 over the substrate 210. Subsequent the gate stack may be formed and sidewall spacers 232 may be formed encapsulating the gate stack by using appropriate techniques as known in the art. The capping layer 226 may be formed prior or subsequent to forming the sidewall spacers 232. The person skilled in the art understands that prior to depositing high-k material 222, gate material 224 and capping layer 226, an etching step is performed to selectively remove insulating material around the fins in order to form recesses between the fins which may have a certain desired depth. The desired depth may be obtained by known techniques, such as time controlled etching or the like. The desired depth may adjust an effective height of the fins. The person skilled in the art understands that IC 200 as depicted in FIG. 2c may be patterned by a mask or hard mask. The mask or hard mask may be overlying the substrate to pattern a trench which is oriented transverse to the fins. Subsequent, the aforementioned etching step may be performed to remove insulating material around the fins in the trench in order to expose an upper surface and portions of sidewall surfaces of the fins to form recesses between the fins. Then the high-k material 222 and the gate material 224 may be deposited in the trench. It is also possible that a dummy gate structure is formed overlying the fins and transverse the fins. Subsequent to forming sidewall spacers at the sides of the dummy gate structure, only the dummy gate structure is removed for exposing the substrate while the sidewall spacers remain. The sidewall spacers may be used as a masking pattern for removing the insulating material between the fins and the sidewall spacers. Therefore, gate electrodes may be formed by forming trenches between the fins along a direction transverse to the fins. The recesses may be formed by removing the first insulating material. Subsequently, a gate stack having a high-k material and a gate material may be formed over the fins and the recesses along the direction transverse to the fins.

Figure 4B:
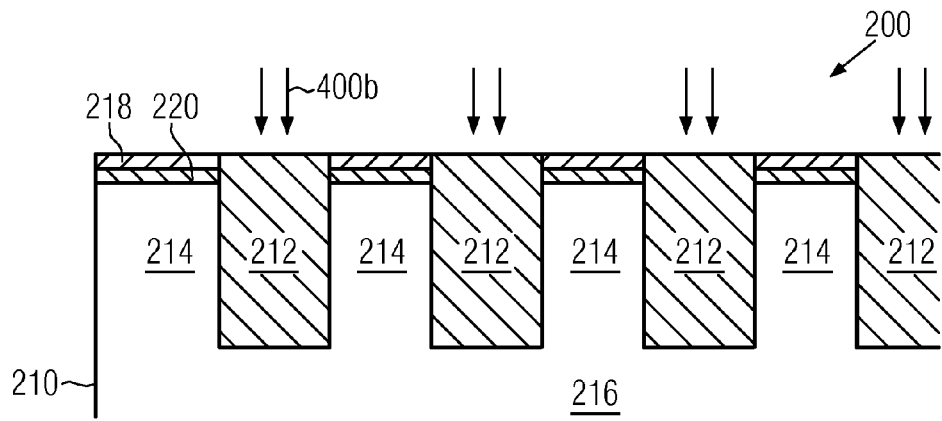
FIG. 4b shows a schematic sectional view of an integrated circuit structure during a further processing step according to an exemplary embodiment of the disclosure.

FIG. 4b illustrates a sectional view taken across the line 4b-4b in FIG. 4a. As depicted in FIG. 4b, fins 214 may be formed in doped well 216 of semiconductor wafer 210. Trenches 212 may be formed in substrate 216 delineating fins 214 and which may be filled with a first insulating material. The first insulating material may be removed from the trenches 212 by a suitable etch process 400b. According to some exemplary embodiments, all of the first insulating material may be removed from the trenches 212 such that semiconductor material of semiconductor bulk material 210 on the ground of the trenches may be exposed. The person skilled in the art will understand that a selective etching process may be applied. According to some other exemplary embodiments, only a certain amount of the first insulating material may be removed from the trenches 212 such that a portion of insulating material remains in the trenches 212 and the trenches may only be exposed to a certain depth such that sidewalls of the fins 214 may be exposed to a certain height relating to the depth of the newly formed trenches when removing first insulating material. The person skilled in the art appreciates that first insulating material having a certain height may be left in the trenches 212 covering the ground of the trenches 212.

The person skilled in the art understands that undoped layer 218 and layer 220 may be omitted. It is therefore noted that, according to other exemplary embodiments, IC 200 may not have layers 218 and 220, i.e., according figures would not depict layers 218, 220, although the other features as described with regard to FIG. 3 may be present and depicted. In the following, no explicit reference is made to layers 218 and 220. Although these layers are not explicitly depicted in what follows, the person skilled in the art understands that layers 218 and 220 may be present or may be omitted. It is explicitly noted that, although the layers 218 and 220 are not depicted anymore in the following figures to be described, some exemplary embodiments of the present disclosure may still provide layers 218 and 220, while other exemplary embodiments may not have layers 218 and 220.

According to some exemplary embodiments, the layers 218 and 220 may be replaced by a layer of insulating material formed on upper exposed surfaces of the fins 214 (later described with regard to FIG. 5c and denoted by reference numeral 285c). The layer of insulating material replacing layers 218 and 220 may be deposited or thermally grown on the fins 214. The formation of the layer of insulating material replacing layers 218 and 220 may be performed by using gate structures (dummy gate structures or gate electrode structures; compare for reference numerals 228, 230 in FIG. 4a) as a masking pattern. The person skilled in the art will understand that the layer of the second insulating material may alternatively be formed on or by means of the undoped layer 218.

Figure 5A:
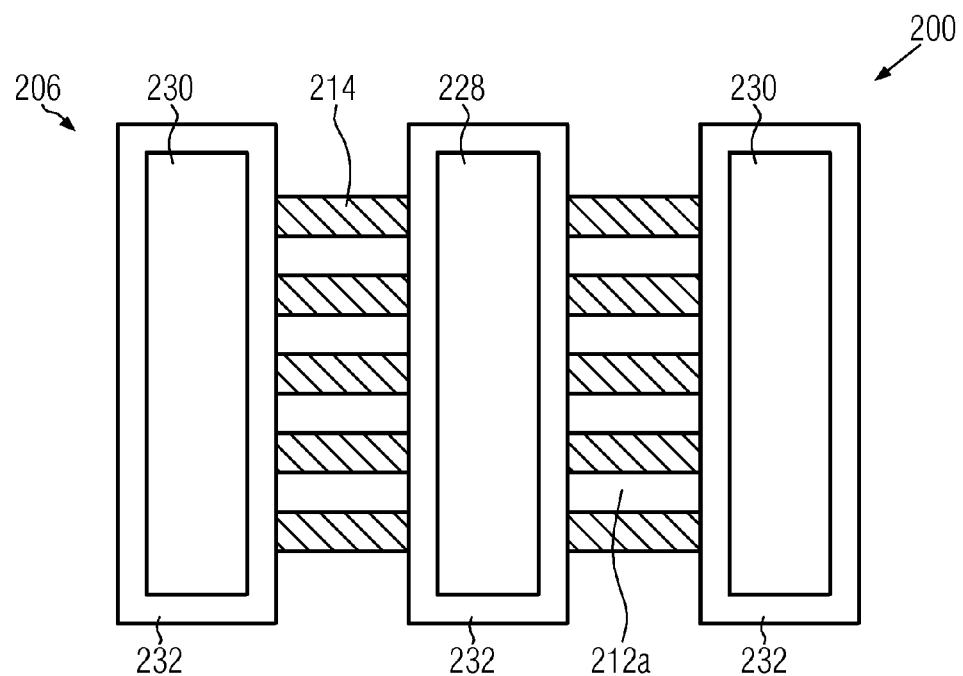
FIGS. 5a and 5b show schematic top views of an integrated circuit structure after further processing according to an exemplary embodiment of the disclosure.

FIG. 5a illustrates, in plan view, IC 200 after the formation of the gate structures 228 and 230 and sidewall spacers 232. In accordance to above given explanations, it is clear that the gate structures may represent a gate electrode structure ("gate first") or dummy gate structure ("replacement gate" or "gate last"). The gate structures 228 and 230 may be formed overlying the fins 214 and trenches 212a and may be disposed transverse to the fins 214 and trenches 212a as depicted in FIG. 5a. According to the schematic plan view as illustrated in FIG. 5a, the gate structures may mask portions of the fins 214 and trenches 212a. Unmasked portions of the fins 214 and trenches 212a may be exposed between the gate structures 228 and 230 and may be disposed at both sides of the gate structure 228. According to some exemplary embodiments, the exposed trenches 212a may be filled with a first insulating material or may not be filled with a first insulating material as explained with regard to FIG. 4b above. Accordingly, the exposed trenches 212a may be filled to a certain height with the first insulating material and portions of the sidewalls of the exposed fins 214 may be exposed, i.e., may not be in contact with the first insulating material. Alternatively, the exposed trenches 212a may not have any insulating material and portions of the bulk substrate 210 (FIG. 4b) may be exposed. It is noted that exposed portions of the fins 214 and exposed portions of the trenches 212a refer to portions of the fins 214 and portions of the trenches that are in particular not masked by the gate structures, i.e., portions over which the gate structures are not formed (portions without overlying gate structures).

Figure 5B:
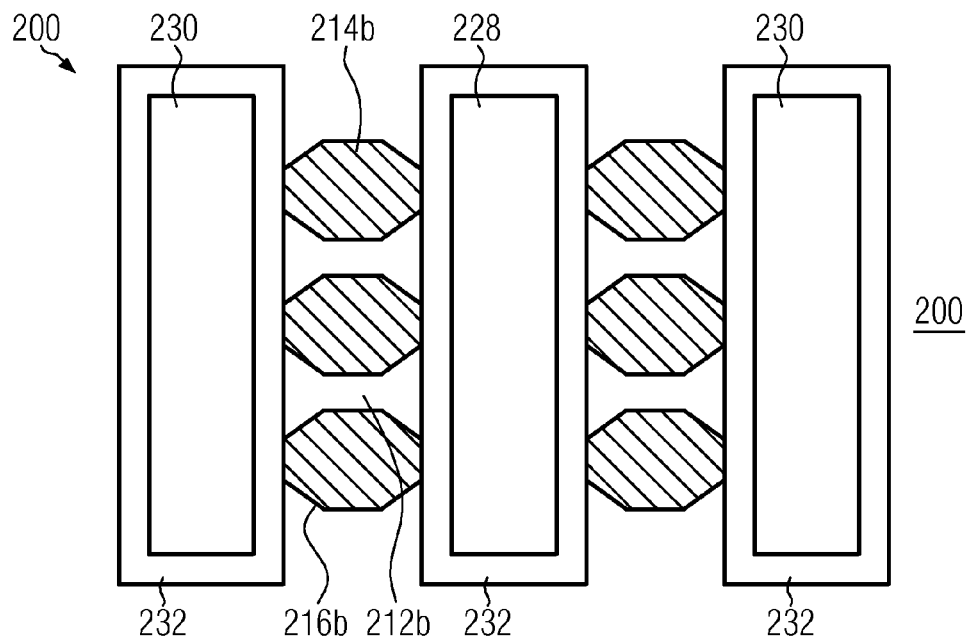

FIG. 5b depicts a plan view of IC 200 in a more advanced stage during processing after protruding portions of semiconductor material are formed on exposed sidewall portions of the fins 214 (FIG. 5a). Fins 214b now have protruding portions formed on exposed sidewall portions in between the gate structures 228, 230, therefore, acting as masking pattern structures for the protruding portions which are aligned with regard to the gate structures 228, 230. The person skilled in the art understands that the gate structures may be formed overlying fins which are dimensioned according to their initial formation in bulk substrate 210. The person skilled in the art understands that the protruding portions protrude towards oppositely disposed protruding portions and extend into trenches 212b. As depicted in FIG. 5b, the protruding portions project into the trenches 212b and extend away from the fins. The trenches 212b may therefore assume a dog-bone form or shape.

Figure 5C:
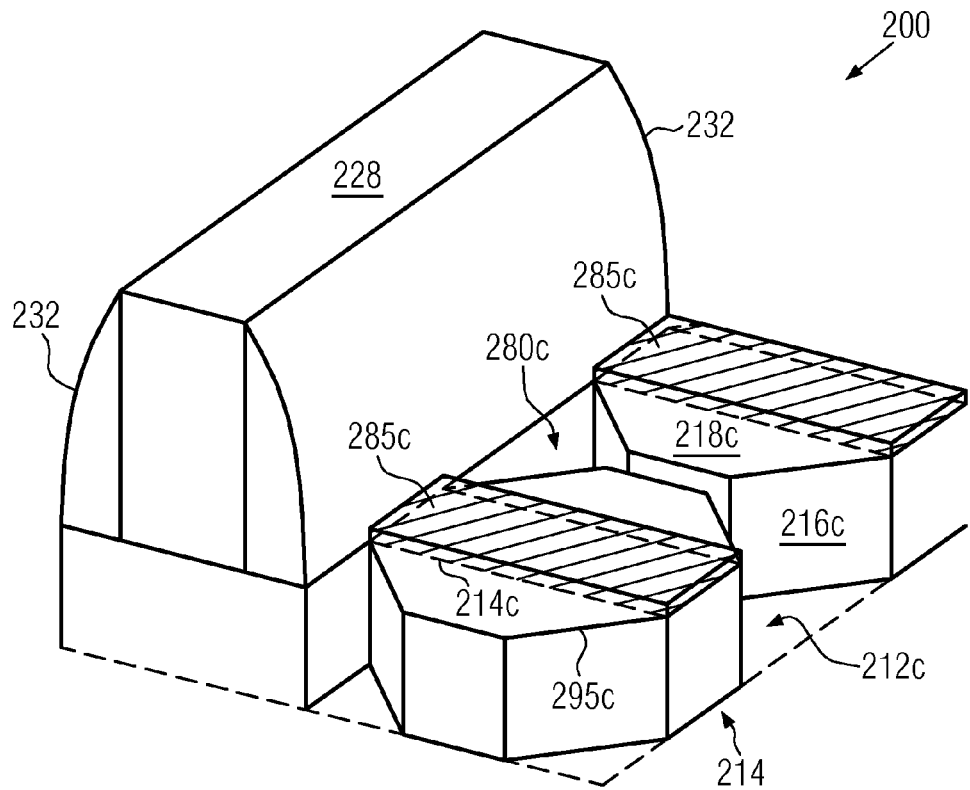
FIG. 5c shows a schematic perspective view of the integrated circuit as depicted in FIG. 5b according to an exemplary embodiment of the disclosure.

FIG. 5c shows a schematic perspective view of a portion of IC 200. FIG. 5c depicts a gate structure 228, sidewall spacer 232 and fins 214, one of which is shown for ease of illustration. It is noted that gate structure 228 may be a dummy gate ("gate last" or "replacement gate") or may be a gate electrode ("gate first") as explained above. On exposed surfaces 214c (schematically illustrated in FIG. 5c by broken lines) of the fins 214, protruding portions 216c are formed. The protruding portions 216c may have at least one tapered surface 295c which may be tapered towards fin 214. The person skilled in the art understands that the tapered surface 295c may be beveled with regard to the exposed surface 214c on which the respective protruding portion is formed. According to some exemplary embodiments, the protruding portions 216c may be of a substantial convex shape.

Between two opposing protruding portions 216c facing each other, a trench 280c may be formed. According to some exemplary embodiments, the trench 280c may be defined by two opposing protruding portions 216c and a surface of a layer of the first insulating material over which the gate structure 228 and the sidewall spacer 232 are formed (a layer of the first insulating material being masked by the gate structure), the layer being disposed between two portions of fins 214 which are covered by the gate structure 228, i.e., portions defined by gate structure 228 overlying the fins. According to some exemplary embodiments, the trench 280c may be dog-bone formed or shaped. The ground 212c of the trench 280c may be formed by the first insulating material or may alternatively be formed by semiconductor material of the bulk substrate 210 and doped well 216, respectively (see FIGS. 2-4). In exemplary embodiments in which have the first insulating material forms the ground 212c of the trench 280c, the height of the trench 280c defines a corresponding height of the protruding portions 216c. In alternative exemplary embodiments, the semiconductor material may form the ground 212c of the trench 280c.

According to some special exemplary embodiments herein, the protruding portions may be formed on exposed sidewall portions on either side of fin 214 by selectively growing a semiconductor material, such as silicon or a silicon having material, on the exposed sidewall portions on either side of fin 214 such that the grown material may project into the trench 212 and may extend away from the fin 214, i.e., its exposed sidewall surface. The silicon having material may be a silicon germanium material, silicon boron material, a silicon arsenic material or a silicon carbon material. The person skilled in the art will understand that the semiconductor material may be a stress-inducing material in order to impose stress on the fin 214 according to some exemplary embodiments. The person skilled in the art understands that the disclosure may provide a fin that may be portion-wise embedded with stress-inducing material.

According to some exemplary embodiments, a layer of insulating material 285c may be formed on the fins 214, i.e., on an upper portion of the fins 214 which is defined by the gate structure 228 and the broken lines 214c. The person skilled in the art will understand that the provision of the insulating layer 285c may cause semiconductor material to be only formed on the exposed sidewall portions 214c of the fins.

According to some exemplary embodiments, the step of selectively growing may provide a step of selective epitaxial growth. As the person skilled in the art understands, this is a variant of plasma-enhanced chemical vapor deposition wherein parameters of the deposition process are adapted such that material is deposited only on the exposed sidewall portions 214c of the fins 214 in the trenches 280c, whereas substantially no material deposition occurs on the fins 214 and the gate structure 228. In general, the selective epitaxial growth process may provide supplying a first reactant having a first chemical element and a second reactant having a second chemical element. A ratio between a flow rate of the first reactant and a flow rate of the second reactant may be changed at least once during the selective epitaxial growth process.

Process parameters, such as temperature, pressure, and composition of the reactant gas, may be adapted such that a layer of material may be deposited only on the exposed portions of the fins 214, in particular on exposed sidewall portions 214c of the fins 214, whereas there may be substantially no deposition on other portions.

The concentration of at least one of the first chemical element and the second chemical element may be controlled by varying flow rates of at least one of the first reactant and the second reactant. In general, a greater ratio between the flow rate of the first reactant and the flow rate of the second reactant may entail a greater concentration of the first chemical element in the deposited material.

In some exemplary embodiments of the present disclosure wherein the substrate 216 provides silicon and wherein an insulating layer 285c formed on the fins 214 and the sidewall spacers 232 may provide silicon dioxide and/or silicon nitride, the first reactant may comprise germane ($GeH_4$) and the second reactant may comprise dichlorosilane ($SiH_2Cl_2$). These reactants may be supplied in gaseous form to form strain-creating elements comprising silicon germanide. Additionally, hydrogen may be provided as a carrier gas and HCl may be supplied in order to increase the selectivity of the epitaxial growth of silicon germanide.

In other exemplary embodiments of the present disclosure wherein the strain-creating elements may comprise silicon carbide, the first reactant may comprise ethene ($C_2H_4$) and the second reactant may comprise silane ($SiH_4$). Additionally, hydrochloric acid (HCl) may be provided in order to increase the selectivity of the growth process.

The person skilled in the art understands that a ratio between the flow rate of the first reactant and the flow rate of the second reactant may be changed during the selective epitaxial growth process in order to affect the deposition rate.

Selective epitaxial growth is discussed in US patent application publications 2007/0254441 and 2008/0026531.

When forming the protruding portions 216c on the exposed sidewall surfaces of the fins 214, tapered surfaces may be formed. According to some exemplary embodiments, a possible way of forming tapered surfaces may comprise controlling the deposition rate during epitaxial deposition. An according epitaxy technique may make use of the effect that the speed of epitaxial growth depends on the orientation of the crystal surface on which material is to be grown. The person skilled in the art understands that growth of silicon on a (111) surface is substantially suppressed, for example.

Figures 5D, 5E:
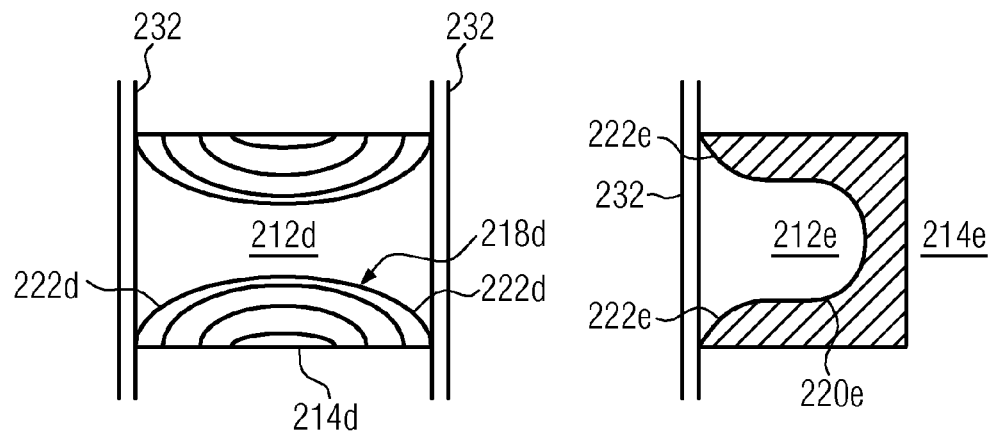
FIGS. 5d and 5e show schematic top views of trenches during selective growth processes according to different exemplary embodiments of the disclosure.

Selective growth processes according to some exemplary embodiments will be explained with regard to FIGS. 5d and 5e. FIG. 5d depicts a plan view of a portion of IC 200 showing a trench 212d, sidewall spacer 232 of a gate structure (not shown) and exposed sidewall portions 214d of fins (not shown). A protruding portion 218d is depicted by lines which represent different sizes of the protruding portion 218d at different times during its formation. The person skilled in the art understands that, in dependence on the crystal orientation of the bulk substrate in which the fins are formed and/or in dependence on the orientation of the fins with regard to the bulk substrate, a selective growth process may be performed as shown in FIG. 5d. As it is further shown in FIG. 5d, tapered surfaces 222d may be formed.

FIG. 5e shows another exemplary embodiment of the present disclosure. In the schematic illustration of FIG. 5e, a plan view of a trench 212e in a semiconductor material 214e and a sidewall spacer 232 of a gate structure (not shown) is given. The trench 212e may delineate fins (not shown) which may be connected at either of their ends by semiconductor material 214e. When performing a selective growth process, material 220e may be deposited on exposed surfaces of semiconductor material 214e and not on the sidewall spacer 232, i.e., not on insulating material (not shown) that is disposed under the sidewall spacer 232. The deposited material 220e may form a protruding portion extending into the trench 212e. The deposited material 220e may form tapered surfaces 222e when material 220e is grown on surfaces adjacent to the sidewall spacer 232.

Subsequent to the above-described processes, the trenches 212b in FIG. 5b, 280c in FIG. 5c, 212d in FIGS. 5d and 212e in FIG. 5e may be filled with a second insulating material. According to some exemplary embodiments, the second insulating material may be filled up to a height that corresponds to the height of the protruding portions, such as protruding portions 216c in FIG. 5c for example. According to some alternative exemplary embodiments, the second insulating material may be filled so as to cover the gate structure and a planarization step, such as a chemical mechanical polishing step, may be performed to expose upper surfaces of the gate structure.

According to some exemplary embodiments, the second insulating material may be different from the first insulating material. According to some exemplary embodiments herein, the second insulating material may be a material having a dielectric constant that is substantially smaller than or equal to 4.0. The second insulating material may be one of silicon oxide, a fluorine-doped silicon oxide, a carbon-doped silicon oxide, a porous silicon oxide, hydrogen silsesquioxane, methylsilsesquioxane, polyimide, polynorbornenes, benzocyclobutene, and polytetrafluoroethylene or may comprise combinations thereof.

According to some exemplary embodiments, the second insulating material may be different from the material of the insulating layer formed on the fins prior to removing the first insulating material from the trenches (compare, for example, 285c in FIG. 5c). According to some exemplary embodiments, the person skilled in the art appreciates that a possible material used for the insulating layer may be given by silicon nitride. The person skilled in the art understands that in forming the second insulating material on upper surfaces of the protruding portions, wherein the second insulating material is different from the material of the insulating layer formed on the fins prior to removing the first insulating material from the trenches, selective provision of stress-inducing materials on the fins and on the protruding portions, respectively, is possible. According to some exemplary embodiments, a layer of stress-inducing material may be formed only over the protruding portions. It is noted that no stress-inducing layer may be formed over the fin because of the insulating layer formed on the fins prior to removing the first insulating material from the trenches. Accordingly, the insulating layer on the fin and the second insulating material filled in the trenches together with gate structure provide a masking pattern for forming a stress-inducing layer over the protruding portions by, for example, selective deposition techniques. According to alternative exemplary embodiments, after filling the trenches with the second insulating material, a layer of second insulating material may be formed on the protruding portions. After selectively removing the insulating layer formed on the fins prior to removing the first insulating material from the trenches, upper surfaces of the fins are exposed. In using the gate structure, the second insulating material as a masking pattern, a layer of stress-inducing material may be formed only over the fin for imposing stress on the fin. The person skilled in the art will understand that, alternatively, a layer of stress-inducing material may be formed over the fin and the protruding portions.

According to some exemplary embodiments, source and drain regions may be formed in the fins and the protruding portions subsequent to the aforementioned processes. Suitable dopant profiles may be implanted by ion implantation techniques, as is well known in the art, using the gate structure and the sidewall spacers as a masking pattern. The person skilled in the art understands that the protruding portions and, accordingly, the source and drain regions may be aligned with regard to the gate structure in a self-aligning manner.

According to some exemplary embodiments, a layer of second insulating material may be formed in between the gate structure over the protruding portions and the layer of insulating material formed on an upper surface of the fins (compare for reference numeral 285c in FIG. 5c). Subsequently, the second insulating material may be removed for only exposing the layer of insulating material. The protruding portions are still covered with the second insulating material. The person skilled in the art may understand that time controlled selective etch techniques may be applied. The layer of insulating material formed on upper surfaces of the fins may be removed for exposing upper surfaces of the fins by using suitable selective etching steps. Subsequently, metal silicide contacts may be formed on the exposed upper surfaces. The person skilled in the art understands that the metal silicide contacts are not formed on the protruding portions. Therefore, it may be reliably taken care that the contacts of source/drain regions and of the gate electrode structure (still to be formed) may come into contact, especially as the second insulating material will be present between the gate electrode contact structure and the source/drain contact structures already at an early stage.

Figure 6:
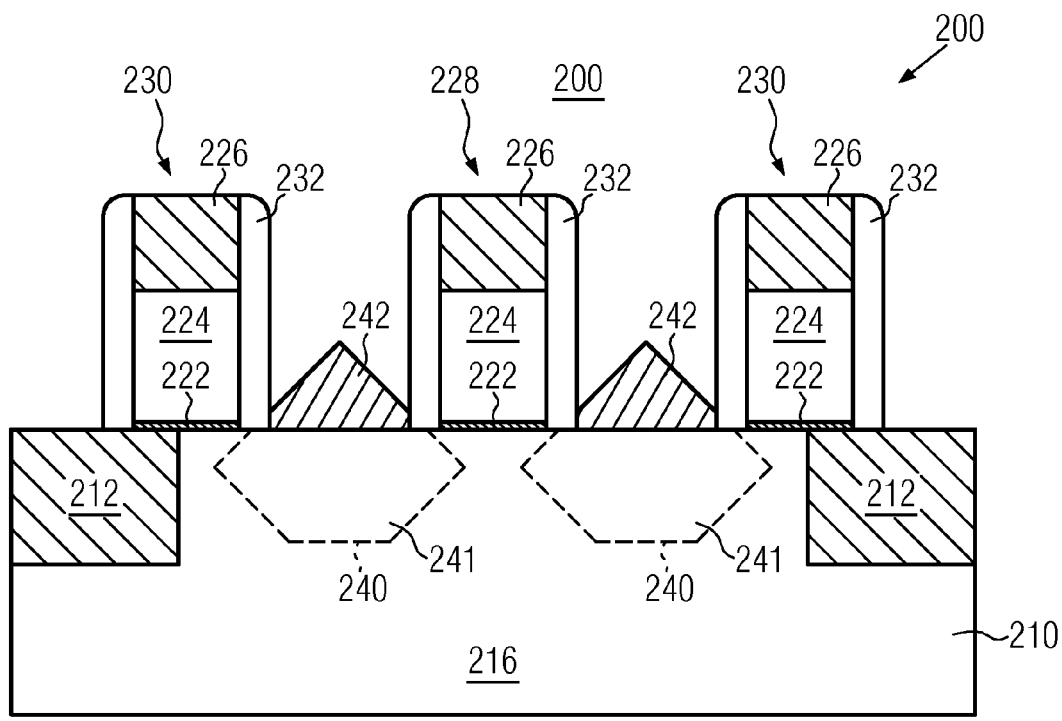
FIG. 6 shows a schematic sectional view of an integrated circuit structure after further processing according to an exemplary embodiment of the disclosure.

According to some exemplary embodiments, stress-inducing regions may be provided within the source and drain regions as will be explained in the following. The mobility of majority carriers in the channel of a MOS transistor may be enhanced by applying a stress to the channel. A compressive longitudinal stress applied to the channel of a P-channel MOS transistor increases the mobility of holes in the channel. Similarly, a tensile longitudinal stress applied to the channel of an N-channel MOS transistor increases the mobility of electrons in the channel. A compressive stress may be applied to the channel by embedding a crystalline material having a lattice constant greater than the lattice constant of the silicon in the host well region and, correspondingly, a tensile stress may be applied by embedding a crystalline material having a smaller lattice constant. Silicon germanium is one crystalline material having a greater lattice constant than silicon and silicon carbon is one crystalline material having a smaller lattice constant than silicon. If a FinFET is to be fabricated with stress enhanced mobility, in addition to the possibilities of providing stress-inducing regions, stress-inducing layers and/or stress-inducing portions, the method in accordance with one exemplary embodiment may proceed as illustrated in FIG. 6. Trenches 240 indicated by the dashed line may be etched into well region 216 using gate structures 228 and 230 and their associated sidewall spacers 232 as an etch mask. Although the trench ideally may have straight vertical walls aligned with the edges of the sidewall spacers, the etchant may preferentially etch more rapidly along certain crystalline planes than along other planes resulting in an irregularly shaped trench. The trench may then be filled by the selective epitaxial growth of stress-inducing material 241, such as silicon germanium for a P-channel transistor and silicon carbon for an N-channel transistor. The trench may be filled with silicon germanium or silicon carbon that is undoped with conductivity determining impurities.

In accordance with one exemplary embodiment, the epitaxial growth may be continued to grow silicon 242 above the original surface of epitaxial layer 218 (see FIG. 4a). Silicon 242 may be doped with conductivity determining impurities such as boron for a P-channel transistor and phosphorus or arsenic for an N-channel transistor. This excess material eventually may form raised source and drain structures and, for the FinFET, may form impurity doped source and drain extensions. The source and drain extensions may be self-aligned to the gate structure 228 and the raised portion provides additional silicon for the source and drain contacts. Again, because of the nature of the crystalline host material and the irregular shape of the trench, the resulting epitaxially grown material may result in a non-planar upper surface. The same embedding of a stress-inducing material may be carried out on planar MOS transistor 204.

In the structure illustrated, gate structure 228 may serve as a placeholder for an active gate that is to be formed by a replacement gate process as described below. Gate structure 230 may also be known as STI tuck-under gates. They may be replaced by tiling gates in the final device structure. Tiling gates serve to establish a substantially uniform density of features across the IC which aids in obtaining uniform processing such as during planarization steps. The tuck-under gates may help provide uniform etching of trenches 240 at the well-STI boundary. In the absence of these gates, faceting of the grown embedded material might or might not occur, depending upon alignment, resulting in variations in the applied stress which, in turn, results in variations in mobility and hence in drive current.

The person skilled in the art will appreciate that the above-described provision of stress-inducing regions in the source and drain regions is not limited to being performed subsequent to forming the protruding portions. It is also possible that the provision of stress-inducing regions may be performed prior to forming the protruding portions. According to some exemplary embodiments, the steps as described with regard to FIG. 6 may be performed prior to performing the etching step 400b as described with regard to FIG. 4b. The person skilled in the art understands that, according to some exemplary embodiments, FIG. 6 may be performed subsequent to the steps as described with regard to FIG. 4a and prior to step 400b as described with regard to FIG. 4b. Subsequent to forming recesses in the fins and forming stress-inducing regions in the formed recesses (as explained with regard to FIG. 6) between the gate structures, step 400b of FIG. 4b may be applied and the protruding portions may be formed as explained above with regard to FIGS. 4b, 5a, 5b, 5c, 5d and 5e. The person skilled in the art will appreciate that according exemplary embodiments may provide stress-inducing regions that are only formed in the fins. Therefore, the stress-inducing regions are not extending into the protruding portions.

Although not illustrated in any of the figures to avoid confusing the drawings, it is again noted that source and drain regions may be formed in the conventional manner by the implantation of conductivity determining ions. For example, on the planar transistor, source and drain extensions and halo regions may be implanted before the formation of sidewall spacers 232. Deep source and drain regions may be implanted into and through the stress-inducing material 242. The P-channel source and drain regions may be formed by implanting boron ions. The N-channel source and drain regions may be formed by implanting arsenic or phosphorus ions. The ions may be implanted into the fins and into the planar MOS transistor using the gate structures as ion implantation masks so as to self-align the source and drain regions to the gate and underlying channel. In the FinFET, source and drain regions may be formed by ion implantation only in FinFETs having relatively short fins because of the limited range of implanted ions. On relatively tall fins, the source and drain extensions are provided by the doped portion of the embedded epitaxial layers with the raised portions forming extra source and drain to contact.

Figure 7:
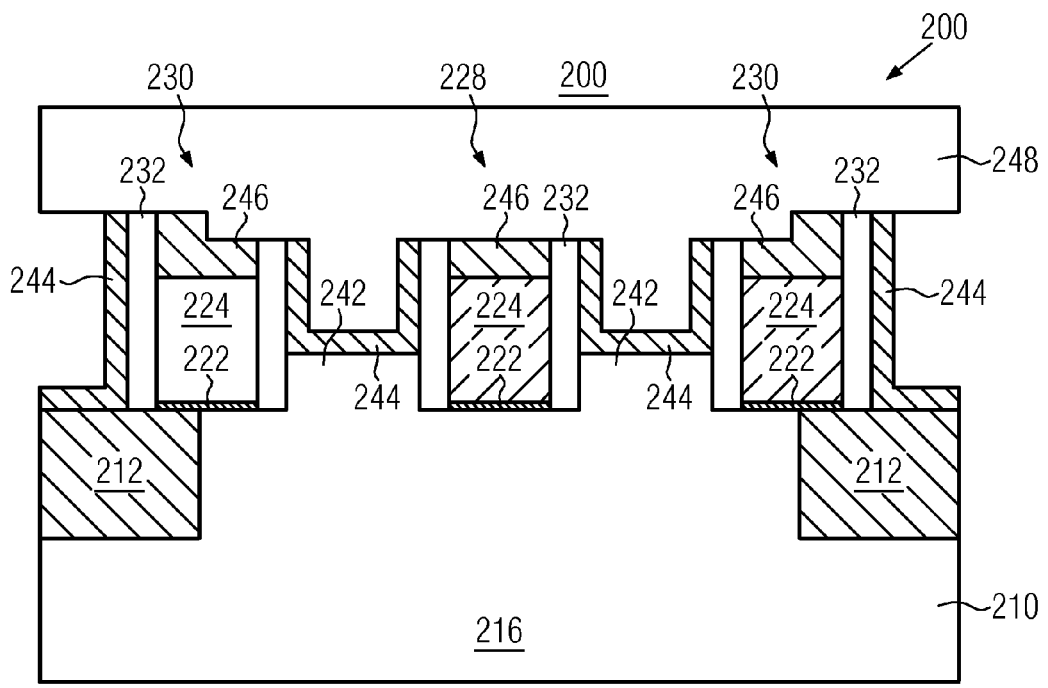
FIG. 7 shows a schematic sectional view of an integrated circuit structure after further processing according to an exemplary embodiment of the disclosure.

The method for fabricating IC 200 may proceed as illustrated in FIG. 7. Although the following description will consider the replacement gate or gate last technique, the person skilled in the art understands that certain processes or steps may be applied to the gate first technique as well. Therefore, the present disclosure is not limited when adopting the replacement gate technique or gate last technique in the following description. A layer of etch stop material 244 may be deposited overlying dummy gate structures 228, 230 and raised source and drain regions 242. The layer of etch stop material may be, for example, a thin layer of silicon nitride having a thickness of about 4-5 nm which may be deposited by plasma enhanced atomic layer deposition (PEALD). For ease of illustration, this and the following figures are simplified by showing the raised source and drain regions as flat and not irregularly shaped. The layer of etch stop material 244 may be polished back, for example, by chemical mechanical planarization (CMP), and a top portion of cap layer 226 (FIG. 6) may be removed. A layer of amorphous silicon 248 may be deposited over the etch stop material and the remaining cap layer 246. The amorphous silicon 248 may back fill the space between sidewall spacers 232 on the sidewalls of dummy gate structures 228 and 230.

Figure 8:
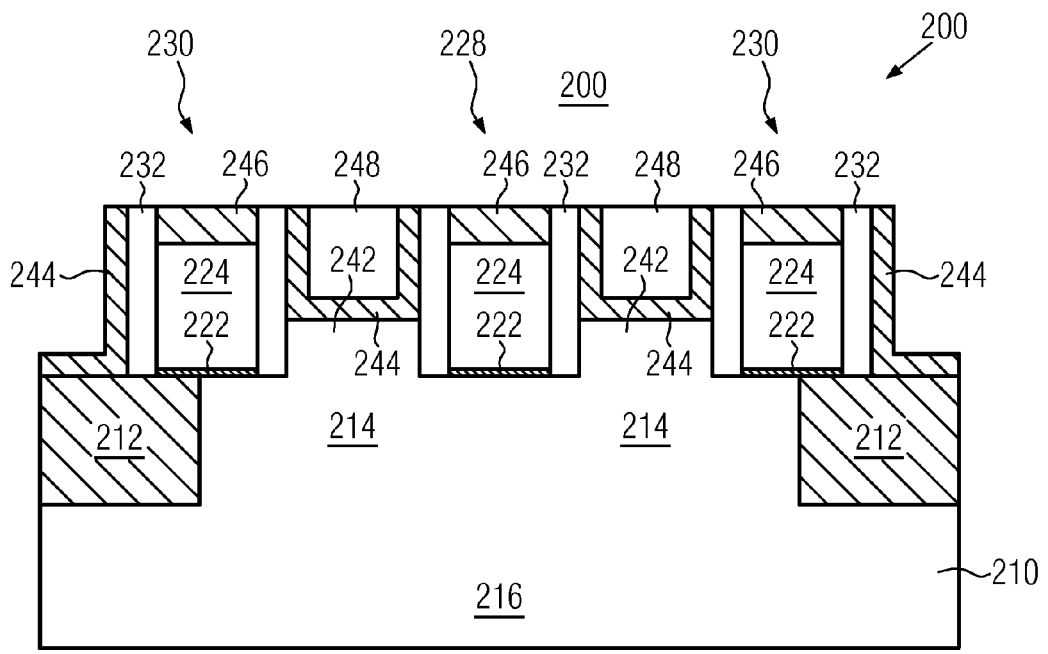
FIG. 8 shows a schematic sectional view of an integrated circuit structure after further processing according to an exemplary embodiment of the disclosure.

The layer of amorphous silicon 248 may be planarized, for example, by CMP, with the planarization stopping on the remaining portion of cap layer 246 as illustrated in FIG. 8. The remaining amorphous silicon 248 may serve as a self-aligned dummy contact or as a dummy back fill, self-aligned and spaced apart from the dummy gate structure. Using two different dummy structures, formed as has been explained, self-aligned to each other, may allow the formation of source and drain contacts self-aligned to gates. According to one exemplary embodiment, silicon germanium has been selected for the material of dummy gate structures 228 and 230 and silicon has been selected for the material of dummy back fill 248 because the two have different etch characteristics. Other materials having such different etch characteristics could also be selected.

Figure 9:
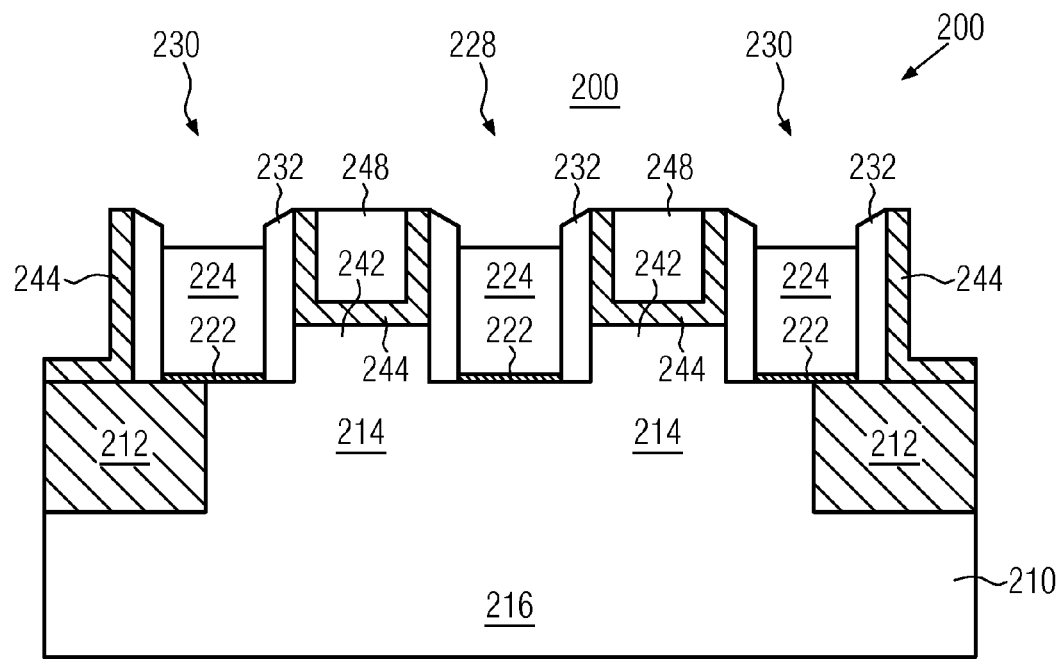
FIG. 9 shows a schematic sectional view of an integrated circuit structure after further processing according to an exemplary embodiment of the disclosure.
Figure 10:
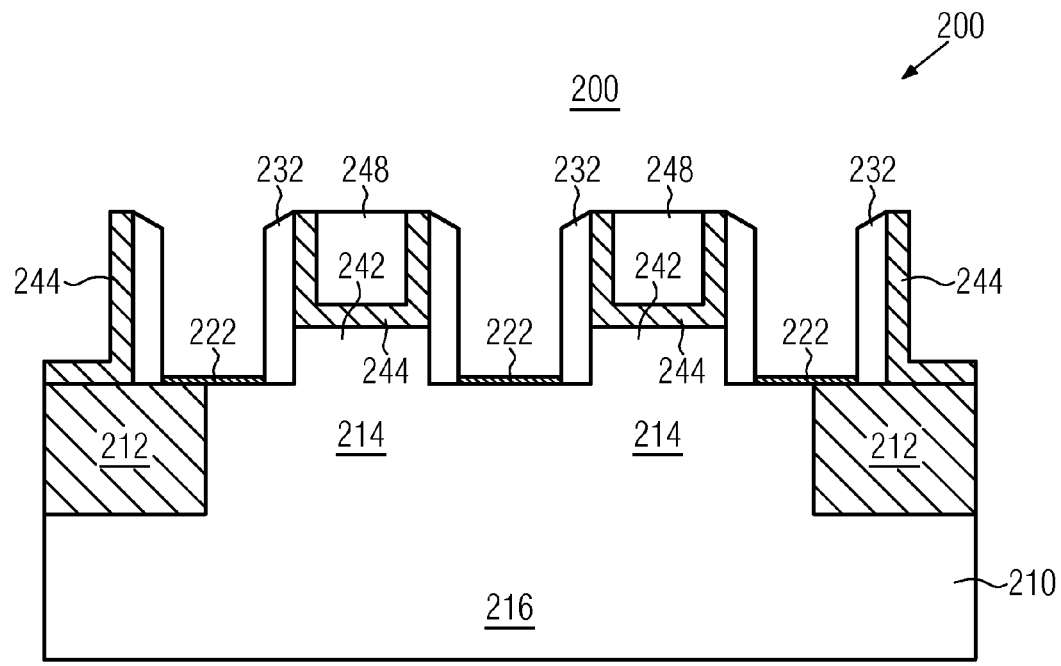
FIG. 10 shows a schematic sectional view of an integrated circuit structure after further processing according to an exemplary embodiment of the disclosure.
Figure 11:
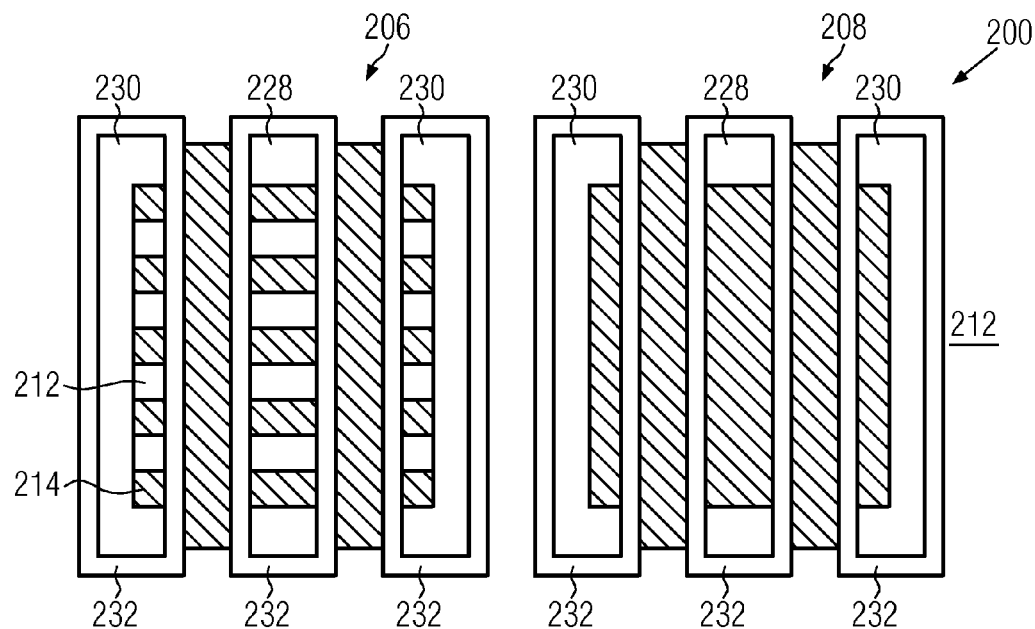
FIG. 11 shows a schematic top view of an integrated circuit structure after further processing according to an exemplary embodiment of the disclosure.

The method for fabricating integrated circuit 200 may continue by removing the remaining portion of cap layer 246 to expose amorphous silicon germanium 224 of dummy gate structures 228 and 230 as illustrated in FIG. 9. The cap layer may be removed in an etchant that is selective and does not etch the silicon or silicon germanium. The amorphous silicon germanium may then be removed as indicated in FIG. 10 and as illustrated in a plan view in FIG. 11. Silicon germanium may be etched in a mixture of ammonium hydroxide and hydrogen peroxide. This etchant removes silicon germanium but does not etch silicon.

Figure 12:
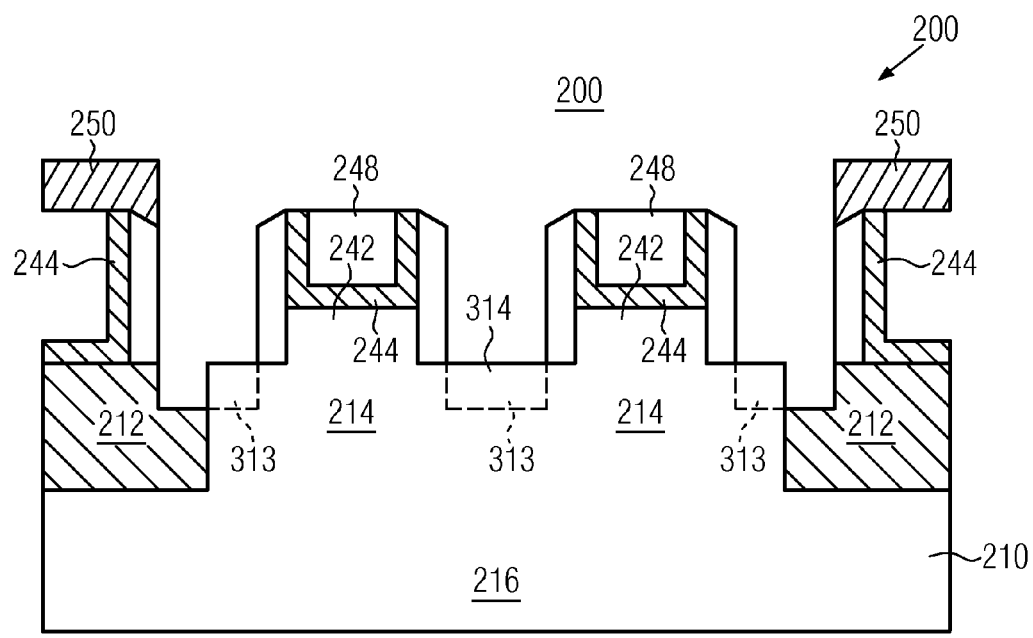
FIG. 12 shows a schematic sectional view of an integrated circuit structure after further processing according to an exemplary embodiment of the disclosure.
Figure 13:
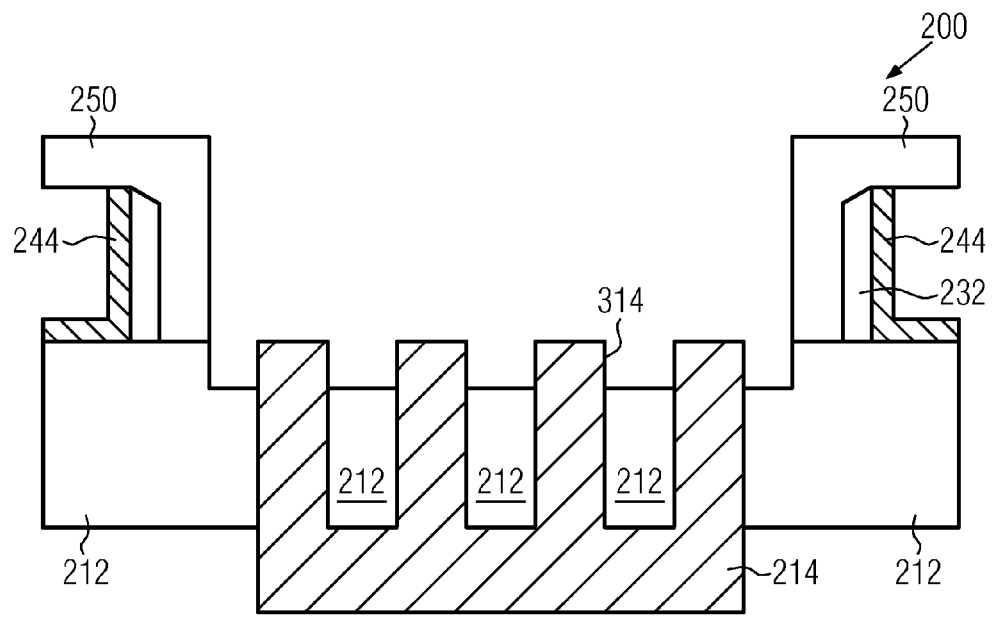
FIG. 13 shows a schematic sectional view of an integrated circuit structure after further processing according to an exemplary embodiment of the disclosure.

The method in accordance with one embodiment may continue as illustrated in FIGS. 12 and 13. FIG. 13 is a cross-sectional view taken along the line Y-Y in FIG. 2c. A photoresist mask layer 250 may be applied and patterned to protect planar device area 208 while exposing FinFET device area 206. With mask layer 250 in place, STI insulation layer 212 may be etched back around fins 214 to reveal a top portion 314 of the fins indicated by the dotted lines 313 in FIG. 12. According to some exemplary embodiments, the exposed top portion 314, the gate wrap-around, may correspond to the undoped epitaxial layer 218 (see FIG. 4a). The undoped channel of the FinFET may be formed in this gate wrap-around area. Although formed early in the fabrication of the IC, the fins are not revealed until late in the processing by the etching of STI 212. Late revealing to the fins is possible because dummy contact structures 248 are in place after the removal of dummy gate structures 228 and 230 (FIG. 9). Revealing the fins only at this late stage in the processing has allowed to perform most of the prior processing steps to be carried out on a substantially planar upper surface of the semiconductor wafer and to not alter conventional in any complicated or incompatible manner. If the fins are revealed early, according to frequent conventional suggestions, processing must be done in three dimensions, which is much more difficult.

Figure 14:
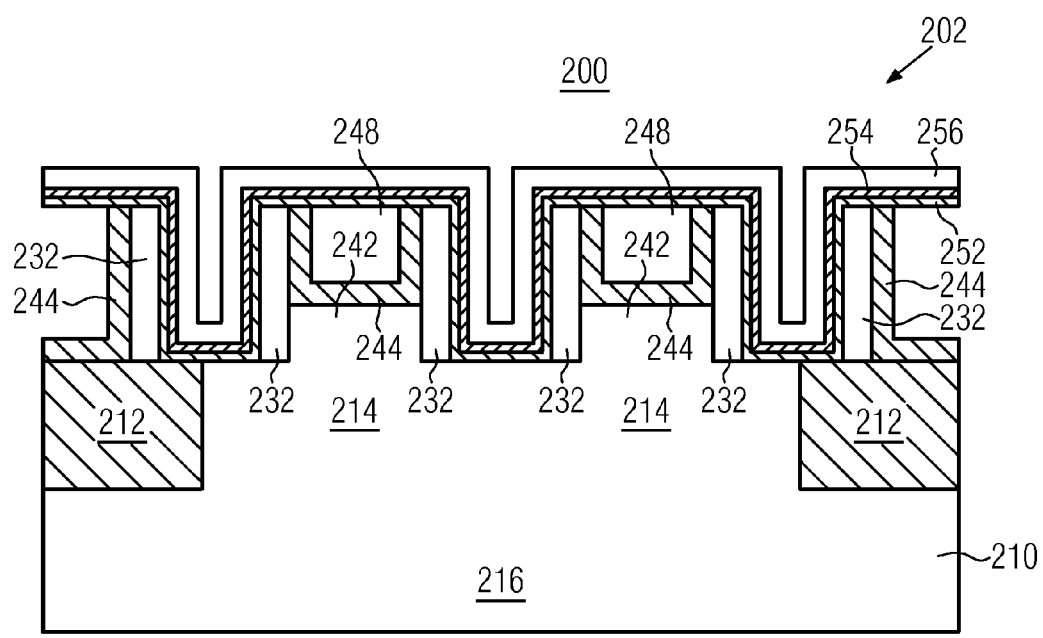
FIG. 14 shows a schematic sectional view of an integrated circuit structure after further processing according to an exemplary embodiment of the disclosure.

As illustrated in FIG. 14, the method may continue by removing patterned photoresist layer 250, cleaning the exposed surface of the fins and depositing a high dielectric constant (high-k) gate insulator layer 252, a cap layer of, for example, TiN 254, and a layer of work function determining material 256. For ease of illustration, this and following figures have been simplified by omitting the gate wrap-around. For a P-channel MOS transistor, the work function determining material 256 may be, for example, titanium nitride. A different work function determining material such as titanium aluminum nitride will be used on the N-channel MOS transistors.

Figure 15:
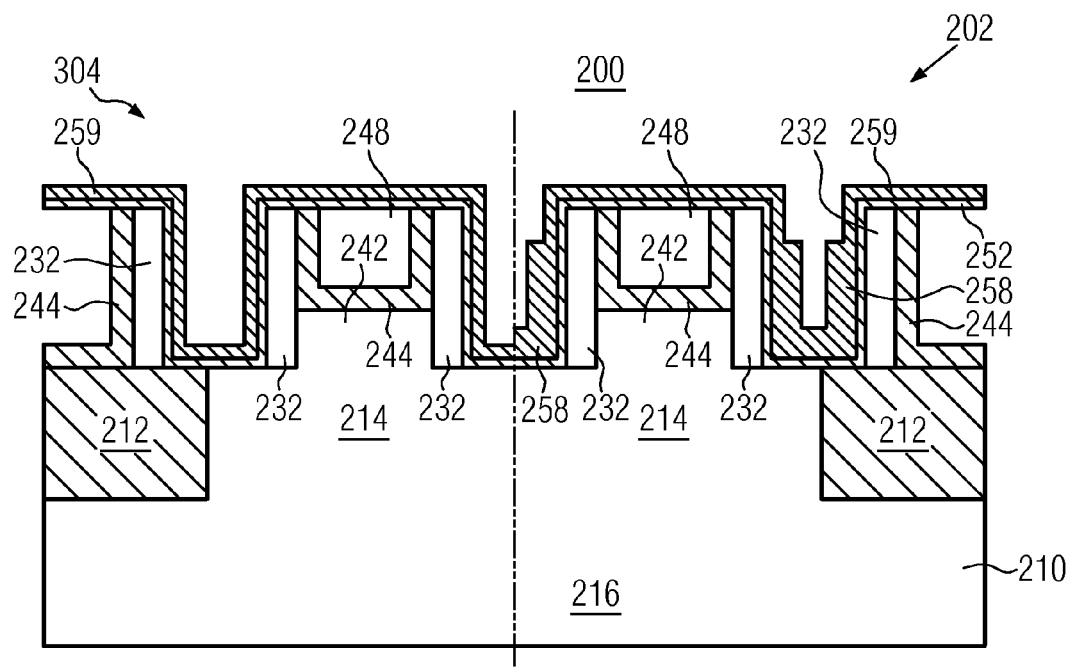
FIG. 15 shows a schematic sectional view of an integrated circuit structure after further processing according to an exemplary embodiment of the disclosure.

FIGS. 15-20 illustrate possible continuing steps in the fabrication of IC 200. In these figures, still showing a cross-sectional view through a fin 214 along line X-X in FIG. 2c, steps in the fabrication of an N-channel FinFET 304 are illustrated on the left and steps in the fabrication of a P-channel FinFET 202 are illustrated on the right. As illustrated in FIG. 15, the TiN may be removed from the N-channel FinFET and the work function determining material 256 (FIG. 14) may be etched back on the P-channel FinFET. In accordance with one exemplary embodiment of the present disclosure, the removal of TiN from the N-channel FinFET may be accomplished by forming a patterned masking layer (not illustrated) such as a patterned layer of spin-on glass overlying the P-channel FinFET followed by etching the TiN. The layer of spin-on glass may then be etched back to leave a portion of reduced thickness only in the gate areas that were vacated by the earlier removal of the amorphous silicon germanium. The reduced thickness of spin-on glass may then be used as an etch mask to remove any work function determining material 256, except in the P-channel gate areas, now labeled 258. A layer of work function determining material 259, such as TiAlN, is deposited overlying the N-channel FinFET 304.

Figure 16:
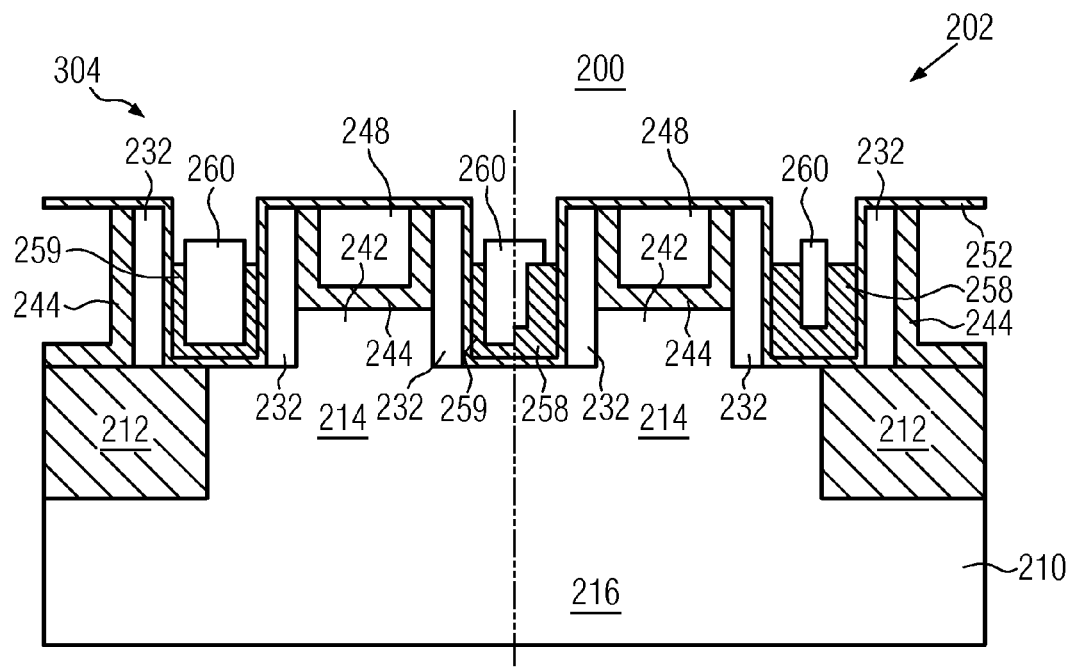
FIG. 16 shows a schematic sectional view of an integrated circuit structure after further processing according to an exemplary embodiment of the disclosure.

As illustrated in FIG. 16, a layer of spin-on glass may be applied and etched back to leave spin-on glass 260 only in the gate areas. The spin-on glass may be used as an etch mask and the work function metal outside the gate areas is removed. An etchant, such as hydrogen peroxide, may etch the work function determining material but may stop on the high-k dielectric material 252.

Figure 17:
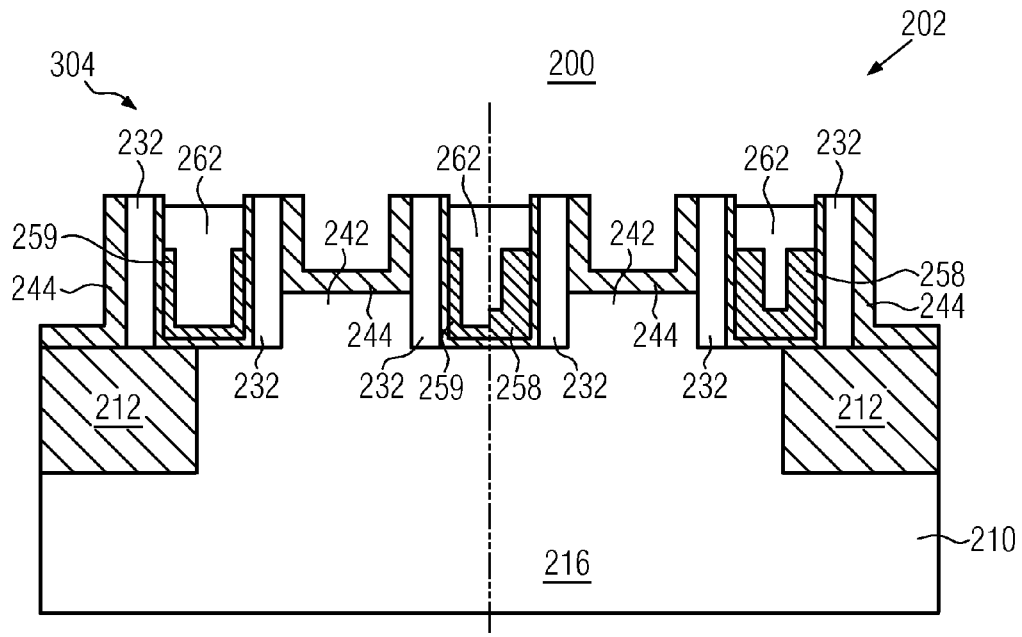
FIG. 17 shows a schematic sectional view of an integrated circuit structure after further processing according to an exemplary embodiment of the disclosure.

In accordance with one exemplary embodiment, additional spin-on glass may be applied and etched back to the high-k dielectric layer 252. The exposed portions of the high-k dielectric layer may be etched, for example, in a $BCl_3$ etchant. The remaining portion 262 of spin-on glass may be used as an etch mask and dummy back fill silicon 248 may be removed from the source and drain contact areas as illustrated in FIG. 17.

Figure 18:
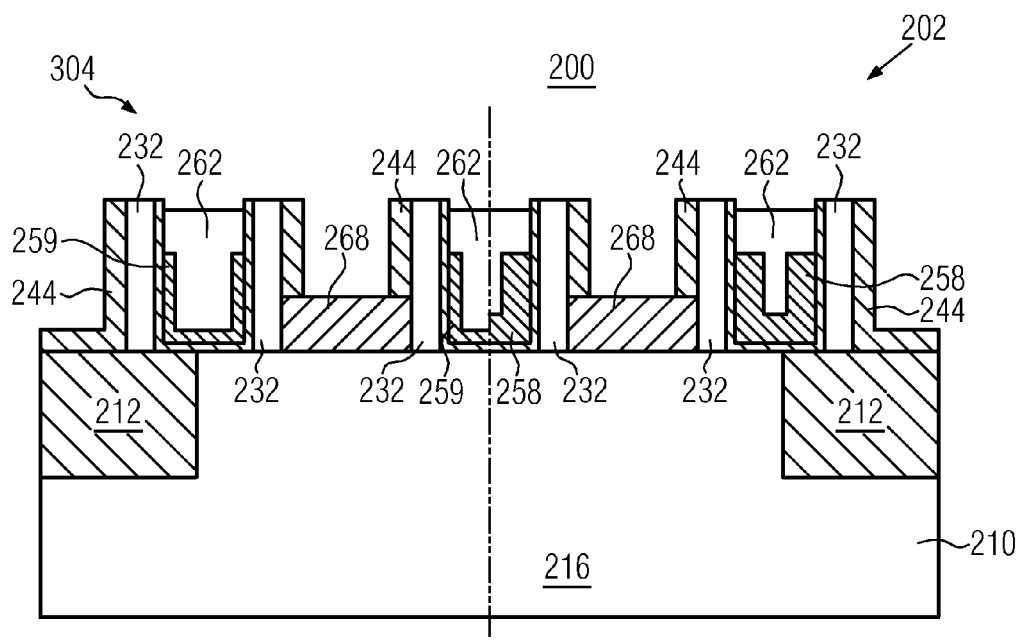
FIG. 18 shows a schematic sectional view of an integrated circuit structure after further processing according to an exemplary embodiment of the disclosure.

The method for fabricating IC 200 may continue as illustrated in FIG. 18 by removing the thin etch stop layer 244 from the bottom of the contact areas. The etch stop layer may be removed, for example, by an anisotropic etchant, leaving the etch stop layer along sidewalls 232. After cleaning the surface of the exposed silicon in the contact areas, a layer of silicide forming metal such as nickel may be deposited and annealed to react the metal with silicon to form metal silicide contacts 268 to the source and drain regions. The annealing temperature used to form the silicide my be lower than temperatures encountered in previous processing steps. It may be advantageous to form the silicide at a late stage in the processing to avoid deleterious effects on the silicide that would result from the higher processing temperatures. The silicide forming that is not in contact with silicon may not react and may be removed, for example in a wet etchant. Following the removal of the unreacted metal, the spin-on glass 262 may be also removed selective to other oxide material present on the substrate. Glass 262 may be removed by first oxidizing the glass to form a poor quality oxide which etches selectively to better quality oxides.

Figure 19:
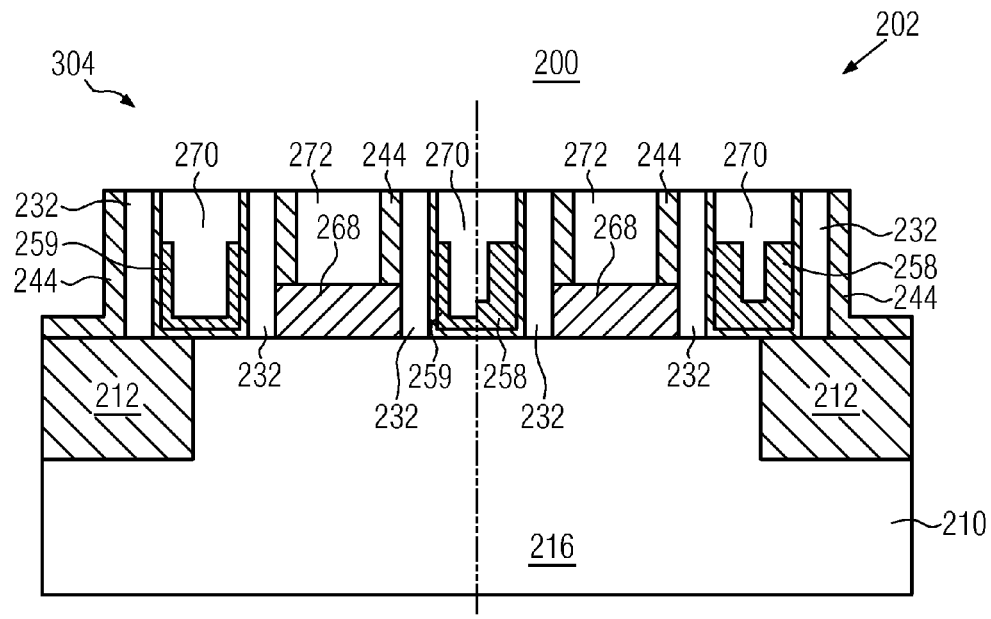
FIG. 19 shows a schematic sectional view of an integrated circuit structure after further processing according to an exemplary embodiment of the disclosure.

A metal gate electrode 270 contacting work function determining metals 258 and 259 and source and drain contacts 272 contacting the metal silicide contacts 268 may be formed as illustrated in FIG. 19. A titanium wetting layer (not illustrated) may first be deposited followed by a layer of, for example, aluminum admixed with a small amount of germanium. Adding 1-2% of germanium to the aluminum may reduce the melting point of the alloy significantly, allowing the alloy to be reflowed into small recesses. The aluminum may be planarized, for example by CMP. The sequential removal of first dummy gate structures 228 and 230 and then the removal of dummy contact structures 248, the latter made possible by the use of the spin-on glass, may allow the gate and contacts to be metallized at the same time and with the same material.

Figure 20:
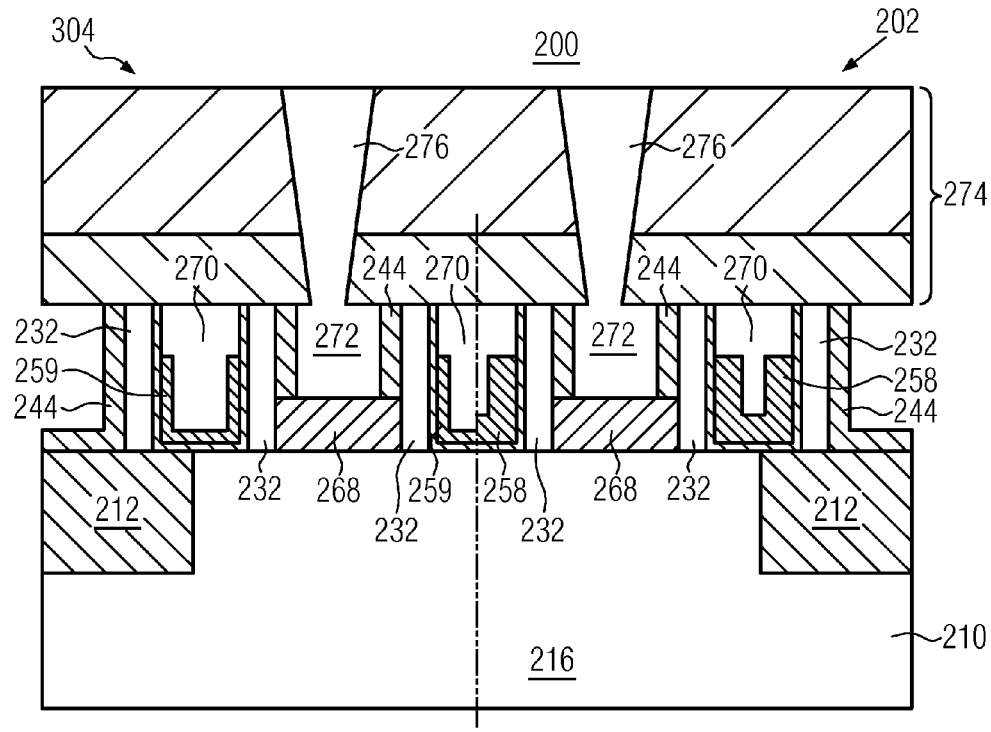
FIG. 20 shows a schematic sectional view of an integrated circuit structure after further processing according to an exemplary embodiment of the disclosure.

An inter-layer dielectric (ILD) 274 may be deposited overlying metal gate electrode 270 and source and drain contacts 272 as illustrated in FIG. 20. The ILD 274 may be a deposited oxide, nitride, other insulating material, or combinations of insulating materials. The top surface of ILD 274 is planarized and vias are etched through the ILD to expose portions of the source and drain contacts. Metal plugs 276 may be formed in the vias in conventional manner as is interconnect metallization and other back end of line processing.

Integrated circuits according to the exemplary embodiments of the present disclosure show various advantages and improvements which increase device performance of semiconductor devices having said integrated circuits. As it is obvious from FIGS. 5*b* and 5*c*, parasitic capacitances formed between the gate electrode and the source regions and drain regions resulting in significantly high gate capacitances may be considerably suppressed. The reason is that, due to the protruding portions having at least one tapered surface tapering towards the respective fin, an insulating material may be provided between the source and drain regions and the gate electrode. Therefore, no surface of the source/drain regions and the gate electrode are in contact and formation of capacitors having parasitic capacitances is avoided.

Figure 1B:
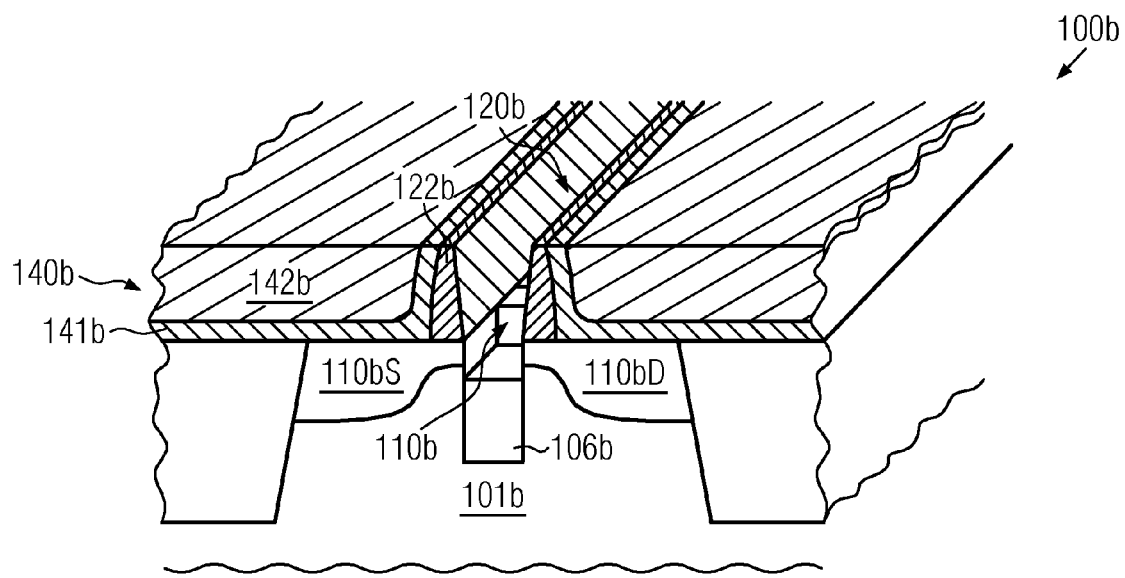
FIG. 1b illustrates another conventional FinFET in a partially cut-away perspective view.
Figure 1C:
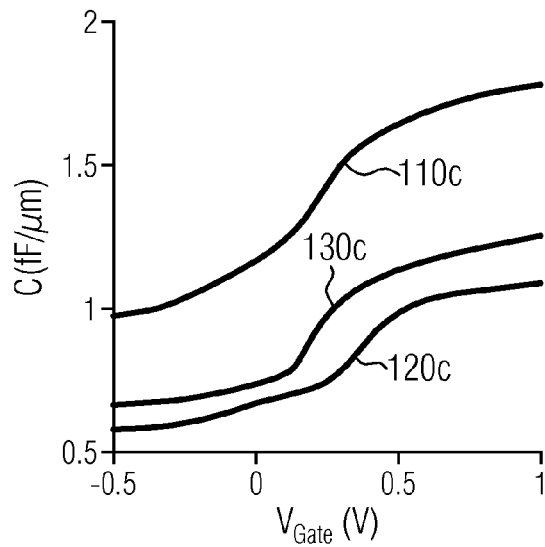
FIG. 1c shows a graph obtained by plotting capacitance C versus $V_{Gate}$ of the conventional FinFET devices shown in FIGS. 1a and 1b.
Figure 1D:
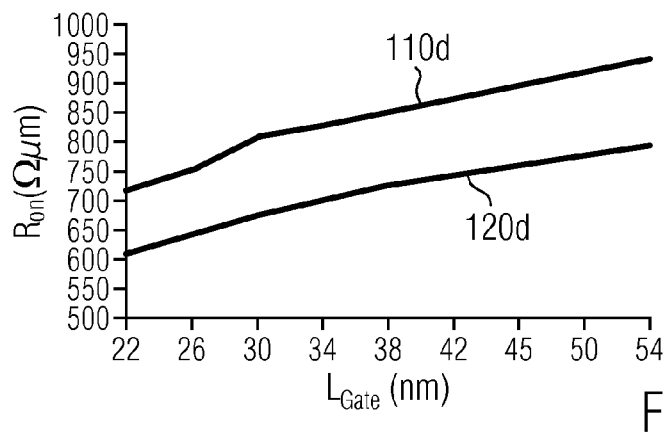
FIG. 1d shows a graph obtained by plotting $R_{ON}$ versus $L_{Gate}$ of the conventional FinFET devices shown in FIGS. 1a and 1b.
Figure 1E:
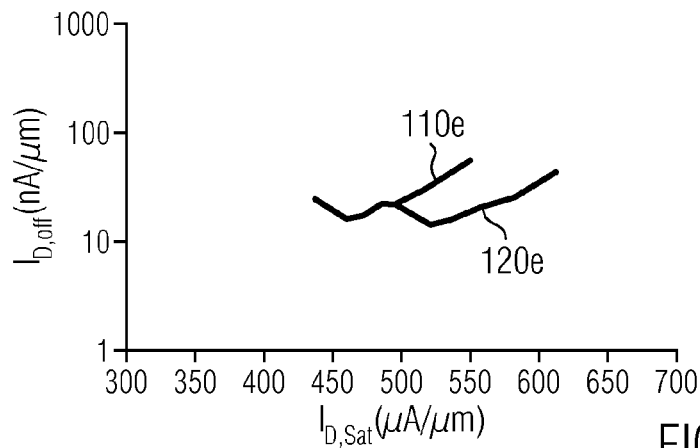
FIG. 1e shows a universal curve obtained by plotting $I_{D,off}$ versus $I_{D,Sat}$ of the conventional FinFET devices shown in FIGS. 1a and 1b.
Figure 21A:
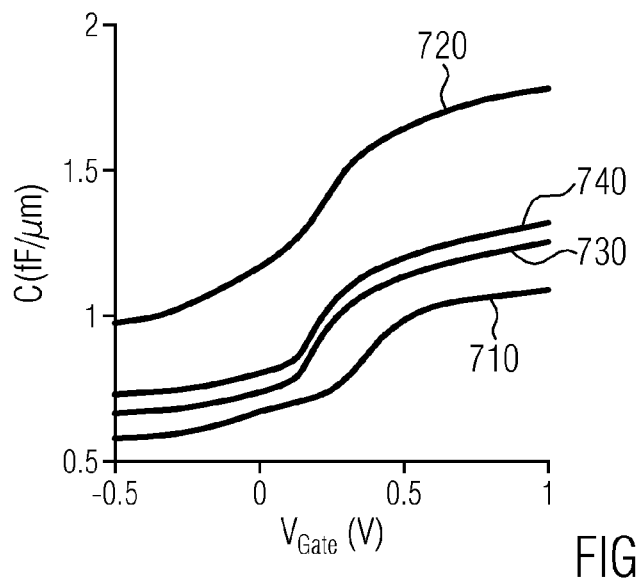
FIG. 21a shows a graph obtained by plotting capacitance C versus $V_{Gate}$ of integrated circuits formed by methods as disclosed according to embodiments of the present disclosure.

FIG. 21*a* shows a diagram depicting a graphical representation of relations between capacitances normalized to effective gate width (C measured in fF/μm, ordinate axis) plotted against gate bias (Voltage applied to gate electrode measured in Volt (V), abscissa) for a FinFET as formed according to the present disclosure in comparison with a conventional FinFET according to a configuration as displayed in FIG. 1*a*, a conventional FinFET according to a configuration as depicted in FIG. 1*b* and a conventional planar FET configuration. Reference numeral 710 denotes a curve corresponding to a conventional planar FinFET. Reference numeral 720 denotes a conventional FinFET which is displayed in FIG. 1*b*. Reference numeral 730 denotes a curve corresponding to a conventional FinFET configuration as explained with regard to FIG. 1*a*. The curve denoted by reference numeral 740 represents the behavior of a FinFET according to the present disclosure. FIG. 1*c* clearly shows that a capacitance of a FinFET according to the present disclosure is considerably lower than the capacitances on curve 720, although curve 740 is slightly above curve 730. The reason is due to the considerable reduction in parasitic capacitances formed between the gate electrode and source/drain regions. The person skilled in the art will appreciate that, by providing a suitable insulating material, such as a low-k material or an ultra low-k material, the curve 740 may be lowered to come closer to curve 710 as parasitic capacitances may be further suppressed or eliminated.

Figure 21B:
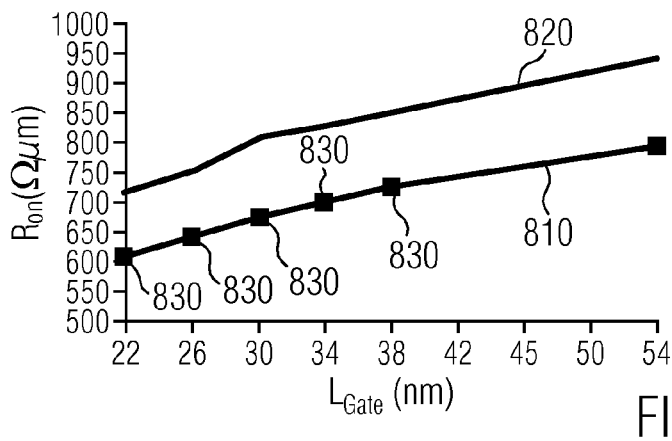
FIG. 21b shows a graph obtained by plotting $R_{ON}$ versus $L_{Gate}$ of integrated circuits formed by methods as disclosed according to embodiments of the present disclosure.

FIG. 21*b* shows a diagram in which a resistance (resistance $R_{ON}$ normalized to effective gate width measured in Ωμm, ordinate axis) is plotted against the gate length ($L_{GATE}$ measured in nm, abscissa). Curve 810 represents the behavior of a conventional FinFET as depicted in FIG. 1*b*, while curve 820 represents the behavior of a conventional FinFET as depicted in FIG. 1*a*. The points denoted by reference numeral 830 denote measurement points that may be expected for a FinFET according to the present disclosure. FIG. 21*b* suggests that the resistance of a FinFET according to the present disclosure is comparable to the resistance of a conventional FinFET as depicted in FIG. 1*b* and improved with regard to a conventional FinFET as depicted in FIG. 1*a*.

Figure 21C:
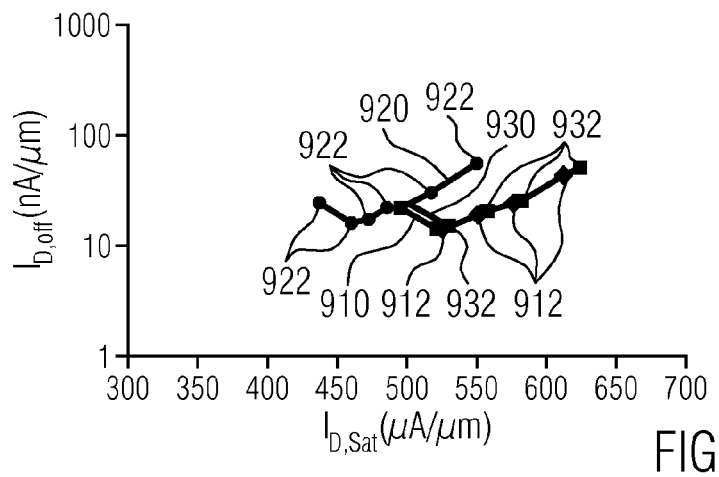
FIG. 21c shows a universal curve obtained by plotting $I_{D,off}$ versus $I_{D,Sat}$ of integrated circuits formed by methods as disclosed according to embodiments of the present disclosure.

FIG. 21*c* shows a diagram of universal curves obtained by plotting a normalized electric drain current during an off state ($I_{D,off}$ normalized to the effective gate width and measured in nA/μm, ordinate axis) against a normalized electrical drain saturation current during operation ($I_{D,Sat}$ normalized to the effective gate width and measured in μA/μm, abscissa) for a FinFET as depicted in FIG. 1*a* which is denoted by 920 and a FinFET as depicted in FIG. 1*b* which is denoted by 910. A curve 930 represents the behavior of a FinFET according to the present disclosure. It is understood from FIG. 21*c* that a FinFET of the present disclosure may be operated at lower power.

FIGS. 21*a*-21*c* show that an integrated circuit according to the present disclosure provides low parasitic capacitances, low resistance values, low leakage currents, and excellent electrostatic behavior at a considerably improved dynamical behavior enabling semiconductor devices that may be operated at low power with improved performance.

The person skilled in the art will appreciate that the present disclosure provides integrated circuits that show a reduced or even substantially eliminated parasitic capacitance and a high drive current.

The person skilled in the art appreciates that the subject matter of the present disclosure may be used in hybrid tri-gate/planar processes or similar FinFET structures. Therefore, the person skilled in the art will appreciate that processes as disclosed have a high potential to fix electrostatic problems of planar MOSFETs in 22 nm and sub-22 nm technologies. Accordingly, the present disclosure provides techniques that may be capable of reaching further FinFET nodes.

It is understood that processes as disclosed are perfectly compatible with the usage of stress transfer regions, especially as occurring in PFET devices for increasing carrier mobility. The person with ordinary skills in the art will appreciate that the aforementioned advantages result in an improved topography for better contact processes, lower contact resistances, lower serial resistances in CMOS structures and increased device performances.

According to certain embodiments, a layer of insulating material is formed on an upper surface of the fins prior to forming protruding portions on sidewall surfaces of the fins. However, this does not impose any limitations on the present disclosure. The person skilled in the art will appreciate that possible alternative embodiments may not show a layer of insulating material on upper surfaces of the fins prior to forming protruding portions. The person skilled in the art understands that, when forming protruding portions, material may be formed on the upper surfaces of the fins. The person skilled in the art will appreciate that raised source and drain regions may thus be formed.

It is understood that the order of steps may be changed in the above description. In the above description, numerous specific details are set forth such as, for example, thicknesses, in order to provide a more thorough understanding of the present disclosure. Those skilled in the art will realize that the numerous specific details as provided may be equipment specific and may accordingly vary from one brand of equipment to another. It will be obvious, however, to one skilled in the art that the present disclosure may be practiced without these details. In other instances, well-known processes have not been described in detail in order to not unnecessarily obscure the present disclosure.

Although this invention has been described relative to specific insulating materials, conductive materials and deposited materials and etching of these materials, it is not limited to the specific materials but only to their specific characteristics, such as conformal and non-conformal, and capabilities, such as depositing and etching. Other materials may be substituted as is well understood by those skilled in the arts after appreciating the present disclosure.

Given the variety of embodiments of the present disclosure just described, the above description and illustrations shown should not be taken as limiting the scope of the present disclosure or of the present invention as defined by the claims.

The present disclosure provides methods for forming integrated circuits and integrated circuits. The integrated circuits comprise gate structures overlying and traverse to one or more fins that are delineated by trenches formed in a semiconductor substrate. Protruding portions are formed in the trenches between the gate structures on exposed sidewall surfaces of the one or more fins. The trenches are filled with an insulating material between the protruding portions and the gate electrode structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming an integrated circuit, comprising:
    etching a plurality of trenches into a silicon substrate and filling the trenches with a first insulating material to delineate a plurality of spaced-apart silicon fins having a longitudinal axis;
    forming gate structures overlying said plurality of fins, each of said gate structures extending in a gate width direction that is transverse to said longitudinal axis of said plurality of fins;
    removing said first insulating material for forming recess trenches between said gate structures and for exposing at least sidewall portions of said spaced-apart silicon fins such that said recess trenches have a depth corresponding to a first height;
    forming protruding portions of semiconductor material on the exposed sidewall portions of said fins, wherein said protruding portions of semiconductor material comprise an outermost protruded surface and at least one tapered portion, wherein said at least one tapered portion is positioned between said outermost protruded surface and one of said gate structures, said at least one tapered portion being formed such that it has a width that increases with increasing distance from said gate structure, wherein said width of said at least one tapered portion is measured in a plane parallel to said gate width direction; and
    filling said recess trenches with a second insulating material up to at least said first height.

2. A method for forming an integrated circuit, comprising:
    forming a mask over a silicon substrate and patterning strip-shaped patterning portions having a longitudinal axis and a plurality of protruding portions protruding outward from the longitudinal axis at both sides of said strip-shaped patterning portions, each protruding portion having at least one tapered portion;
    removing the substrate material according to the formed mask, thereby forming recesses in contact with said tapered portions;
    filling said recesses with an insulating material; and
    forming gate structures overlying said recesses such that the tapered portions are exposed, each of said gate structures extending in a gate width direction, wherein each tapered portion has a width that increases with increasing distance from one of said gate structures and wherein said width of said tapered portion is measured in a plane parallel to said gate width direction.

3. The method of claim 1, further comprising forming a layer of insulating material on upper surfaces of said fins by using the gate structures as a masking pattern prior to forming the protruding portions.

4. The method of claim 3, wherein said layer of insulating material is formed from an insulating material that is different from said second insulating material.

5. The method of claim 4, further comprising selectively removing said layer of insulating material for exposing upper surfaces of said fins and depositing a stress-inducing material on the exposed upper surfaces of said fins.

6. The method of claim 4, further comprising selectively removing said second insulating material for exposing an upper surface of the protruding portions and depositing a stress-inducing material on the exposed upper surfaces of the protruding portions.

7. The method of claim 4, further comprising removing said second insulating material for exposing said layer of insulating material, then removing said layer of insulating material to expose upper surfaces of said fins and subsequently forming metal silicide contacts on the exposed upper surfaces such that the metal silicide contacts are not formed on the protruding portions.

8. The method of claim 1, wherein forming protruding portions of silicon on the exposed sidewall portions of said fins comprises selectively growing a semiconductor material on the exposed sidewall portions of said spaced-apart silicon fins.

9. The method of claim 8, wherein selectively growing said semiconductor material comprises growing a stress-inducing material.

10. The method of claim 1, further comprising performing an implantation step for forming source and drain extension regions by using said gate structures as a masking pattern subsequent to filling said recessed trenches with said insulating material.

11. The method of claim 1, wherein forming said gate structures comprises forming gate electrodes aligned with said gate structures.

12. The method of claim 11, wherein forming gate electrodes comprises forming trenches between said fins along a direction transverse to said fins by removing said first insulating material and forming a gate stack comprising a high-k material and a gate material over said fins and the recesses along the direction transverse to said fins.

13. The method of claim 1, wherein forming said gate structures comprises forming dummy gate structures and the method further comprises forming gate electrodes by replacing said dummy gate structures subsequent to filling said recess trenches with said second insulating material.

14. The method of claim 1, further comprising forming trenches at least in said plurality of fins subsequent to forming said gate structures and filling the trenches with a stress-inducing material.

* * * * *